(12) United States Patent  
Tieben et al.

(10) Patent No.: US 10,784,135 B2  
(45) Date of Patent: Sep. 22, 2020

(54) SUBSTRATE CONTAINER WITH IMPROVED SUBSTRATE RETAINER AND DOOR LATCH ASSIST MECHANISM

(71) Applicant: Entegris, Inc., Billerica, MA (US)

(72) Inventors: Anthony Mathius Tieben, Jodan, MN (US); Christopher Strickhouser, Mounment, CO (US)

(73) Assignee: ENTEGRIS, INC., Billerica, MA (US)

( * ) Notice: Subject to any disclaimer, the term of this patent is extended or adjusted under 35 U.S.C. 154(b) by 128 days.

(21) Appl. No.: 15/765,076

(22) PCT Filed: Sep. 12, 2016

(86) PCT No.: PCT/US2016/051216  
§ 371 (c)(1),  
(2) Date: Mar. 30, 2018

(87) PCT Pub. No.: WO2017/058497  
PCT Pub. Date: Apr. 6, 2017

(65) Prior Publication Data  
US 2018/0277409 A1    Sep. 27, 2018

Related U.S. Application Data

(60) Provisional application No. 62/235,682, filed on Oct. 1, 2015, provisional application No. 62/339,404, filed on May 20, 2016.

(51) Int. Cl.  
*H01L 21/673* (2006.01)

(52) U.S. Cl.  
CPC .. *H01L 21/67369* (2013.01); *H01L 21/67373* (2013.01)

(58) Field of Classification Search  
CPC ......... H01L 21/67369; H01L 21/67373; H01L 21/67386; H01L 21/6735; H01L 21/67359; H01L 21/67; B65D 85/48  
(Continued)

(56) References Cited

U.S. PATENT DOCUMENTS

| 4,995,430 A | 2/1991 | Bonora et al. |
| 5,452,795 A | 9/1995 | Gallagher et al. |

(Continued)

FOREIGN PATENT DOCUMENTS

| WO | 87/04043 A1 | 7/1987 |
| WO | 2007/146019 A2 | 12/2007 |

*Primary Examiner* — Rafael A Ortiz  
(74) *Attorney, Agent, or Firm* — Entegris, Inc.

(57) ABSTRACT

A substrate container with a substrate retainer mounted to a biased actuation linkage, and a door assembly with latch assist. Various configurations for biasing the substrate retainer in a substrate non-engagement position are disclosed. The biasing helps prevent the substrate retainer from hanging up due to friction that might otherwise counter the gravitational force that is otherwise relied upon for disengagement. The assembly may also include retention clips that positively secure the substrate retainer to the actuation linkage. The latch assist provides springs that deliver stored energy to assist in latching and unlatching the door assembly from the substrate carrier. The latch assist further provides off-center forces that bias the latching mechanism in either an unlatched or a fully latched configuration.

6 Claims, 24 Drawing Sheets

(58) Field of Classification Search
USPC .................. 206/710, 711, 712, 701, 454
See application file for complete search history.

(56) References Cited

U.S. PATENT DOCUMENTS

| | | | |
|---|---|---|---|
| 5,513,750 A * | 5/1996 | Rychel | A63C 17/00 |
| | | | 206/303 |
| 5,960,959 A | 10/1999 | Wu et al. | |
| 2007/0108095 A1 | 5/2007 | Bums et al. | |
| 2015/0090630 A1 * | 4/2015 | Yang | H01L 21/67369 |
| | | | 206/711 |

* cited by examiner

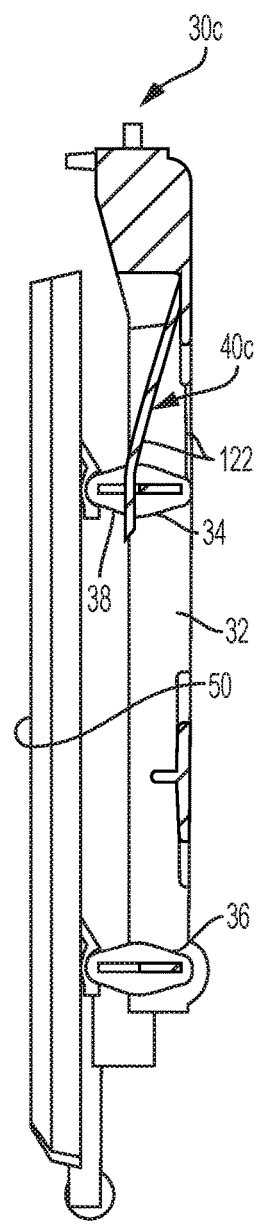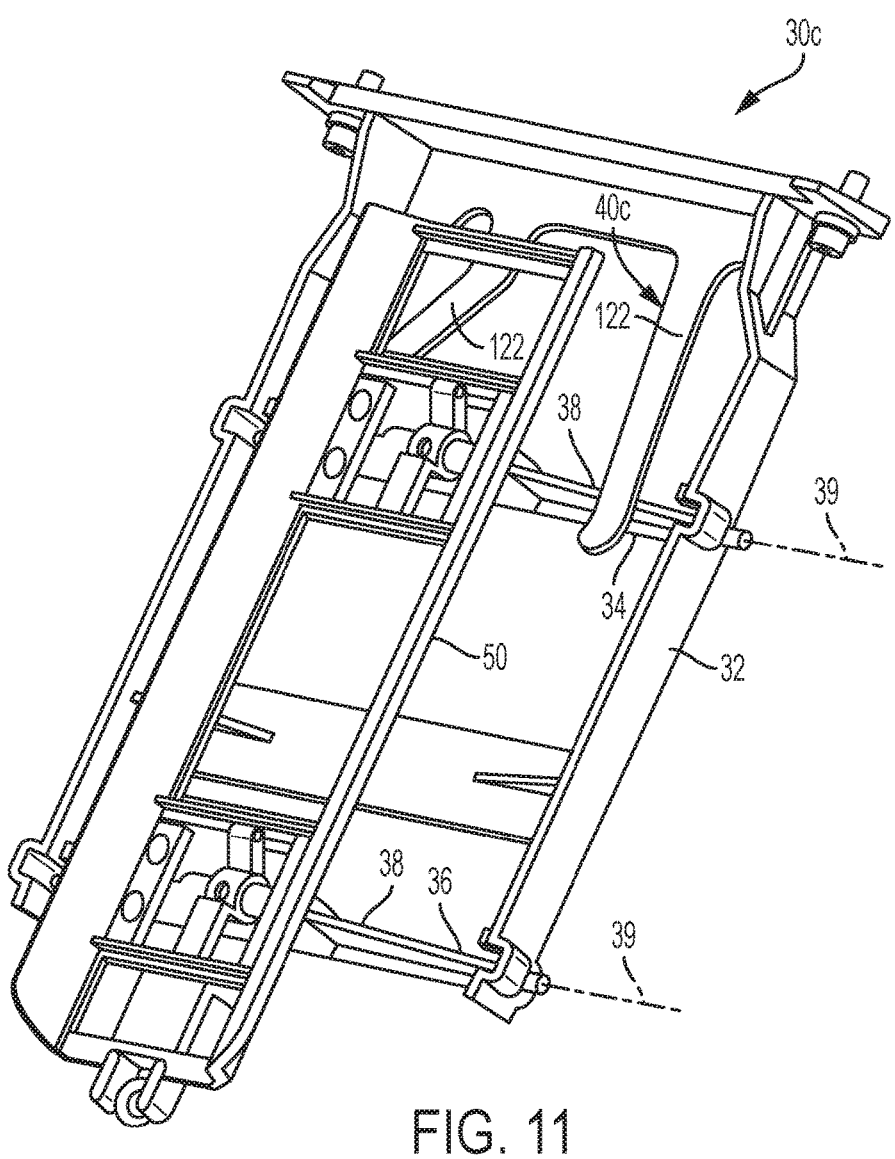
FIG. 10
FIG. 11

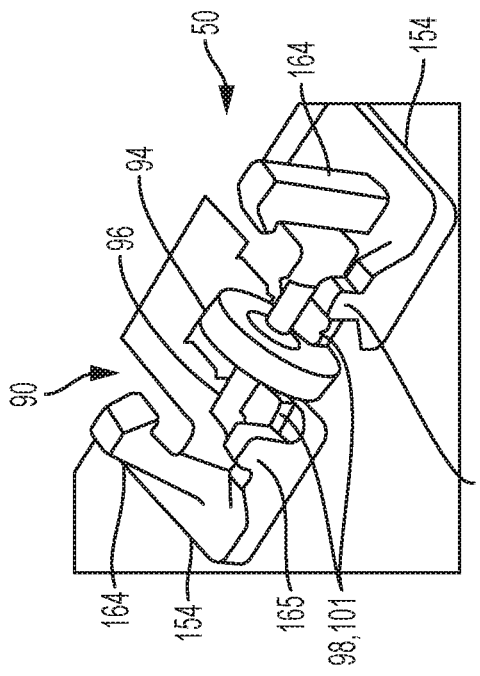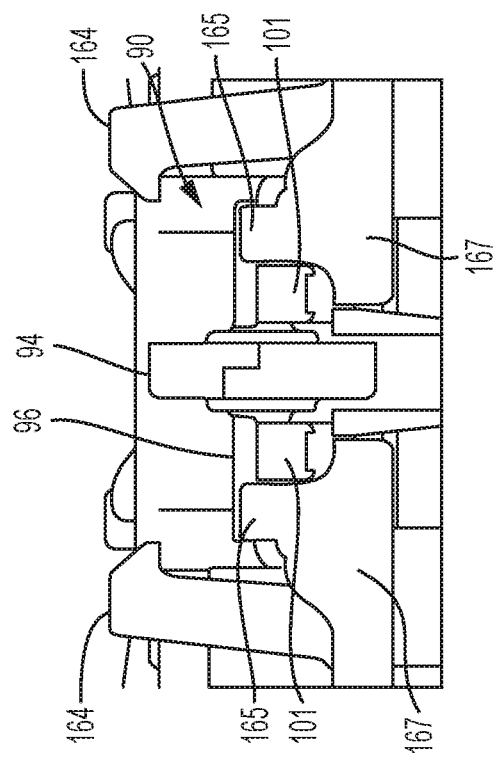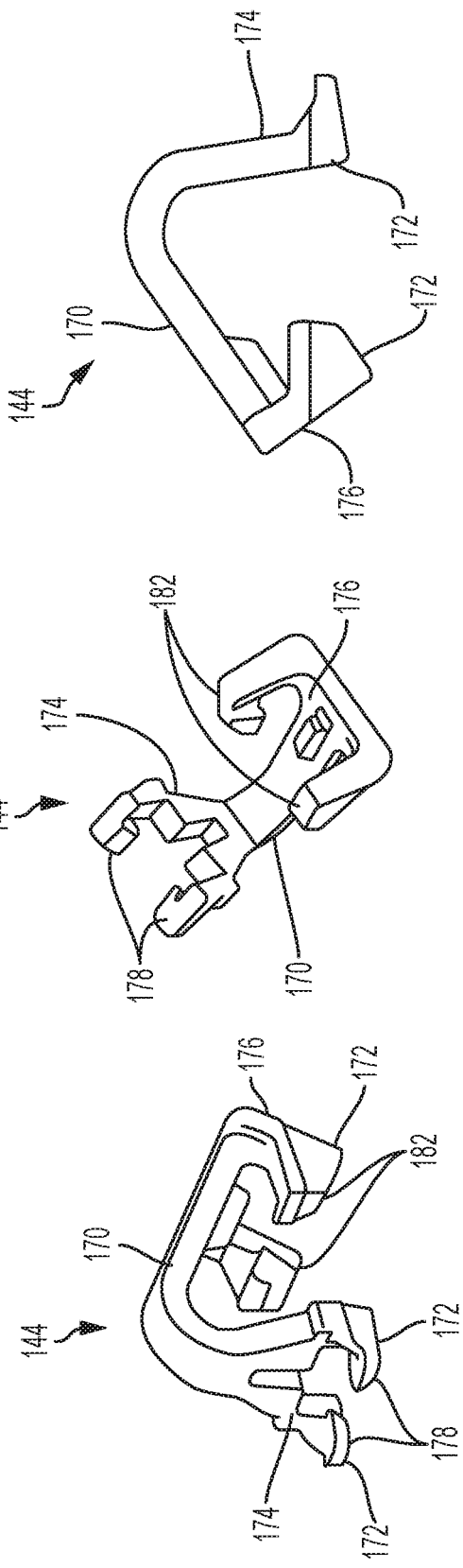

SUBSTRATE CONTAINER WITH IMPROVED SUBSTRATE RETAINER AND DOOR LATCH ASSIST MECHANISM

RELATED APPLICATIONS

This application is a U.S. national phase under the provisions of 35 U.S.C. § 371 of International Patent Application No. PCT/US2016/051216 filed Sep. 12, 2016, which in turn claims priority to U.S. Provisional Application Ser. No. 62/235,682, filed Oct. 1, 2015 and titled "Substrate Container with Improved Wafer Retainer and Door Latch Assist Mechanism," and also claims priority to U.S. Provisional Application Ser. No. 62/339,404, filed May 20, 2016 and titled "Substrate Container with Improved Substrate Retainer and Door Latch Assist Mechanism," the entire contents of which are hereby incorporated by reference herein in their entireties, for all purposes.

FIELD OF THE DISCLOSURE

The disclosure relates to devices for confining substrates such as memory disks, silicon wafers, and the like for transport, storage or processing. More particularly, the disclosure relates to a substrate retention structure and door latch mechanisms.

BACKGROUND

Certain containers are utilized for transporting and storing batches of substrates, such as silicon wafers or magnetic disks, before, during, and after processing of the substrates. "Wafers" as used herein refers to silicon wafers, magnetic substrates, and the like. The substrates are processed into integrated circuits and the disks are processed into a magnetic storage disks for computers. The processing of wafer disks into integrated circuit chips often involves several steps where the disks are repeatedly processed, stored and transported. Due to the delicate nature of the disks and their extreme value, it is vital that they are properly protected and securely retained throughout this procedure. Accordingly, substrate containers are generally configured to accommodate a carrier that supports the substrates within slots or on shelf members near the peripheral edges of the substrates.

Some conventional containers are configured to hold an H-bar style carrier, such as a standardized mechanical interface (SMIF) pod. SMIF pods typically have a bottom opening door at the base of a housing for accessing the H-bar carrier with substrates. SMIF pods generally include a substrate retainer that is rotatably mounted to an actuation linkage. Coupling of the bottom door with the housing exerts a force on the actuation linkage that swing the substrate retainer into contact with peripheral edges of the substrates. When engaged, the substrate retainer prevents the substrates from sliding laterally with respect to a vertical axis of the substrates. Upon removal of the bottom door from the housing, the actuation linkage causes the substrate retainer to disengage (swings away from) the substrates, so that the substrates and H-bar carrier are freely removed from the housing with the bottom door.

Substrate retainers of conventional SMIF pods are known to "hang up" upon removal of the bottom door. During a hang up, when the door is removed, the actuation linkage does not swing the substrate retainer away from the substrates. Such hang up of the substrate retainer can result in interference with removal of the substrates, which can cause a catastrophic loss of all the substrates due to the interference during subsequent handling or mishandling by the robotic end effectors. A wafer container that prevents hang up of the substrate retainer during operation would be welcomed.

SUMMARY OF THE DISCLOSURE

Various embodiments of the disclosure provide reliable, continuous biasing of the substrate retainer from a substrate retention configuration into a substrate non-retention configuration. The continuous biasing supplements, reduces, or otherwise replaces the reliance on gravity to disengage the substrate retainer from the substrates, thereby assuring safe removal of the substrates from the substrate container.

In conventional SMIF pods, the weight of the substrate retainer (i.e., gravity) provides the sole motivation for disengagement of the substrate retainer from the substrates upon removal of the door. Substrate retainers, which are typically fabricated from polymers, may produce surfaces that have an adherence quality, especially after cleaning of the substrate container within which the substrate retainer resides. The adherence quality gives the mechanism a "stickiness" that has been observed to cause the substrate retainer to hang up and to not satisfactorily disengage from the substrates. Various embodiments of the disclosure provide a biasing of the actuation linkage, continuously, so that the actuation linkage overcomes any stickiness throughout the stroke of the actuation linkage, from fully engaged to fully opened. Such continuous biasing assures that the substrate retainer will be free and clear of the wafers when the bottom door and attendant H-bar carrier is removed from the housing.

In some instances, a deleterious effect of applying a biasing force on the actuation linkage can be that the actuation linkage experiences forces that are greater than original design criteria, to the point that the added force loads cannot be sustained. For example, when the bottom door is in place and the actuation linkage is compressed between bottom door and the biasing force of the actuation linkage, the stress at certain points on the linkage (e.g., the clip mounting at the roller wheel that rides along the inner face of the bottom door during actuation, and/or at the pivots between the actuation linkage and the substrate retainer) may be several times greater than a system that is designed for gravity biasing. Such additional forces caused by the biasing may be enough for increased instances of the actuation linkage assembly to become dismembered. For example, the roller wheel may disengage from the substrate retainer, and/or the substrate retainer may become dislodged from the pivots of the actuation linkage assembly. Such dismemberment of the actuation linkage assembly can cause equally catastrophic effects as the aforementioned hang up of the substrate retainer.

Accordingly, various embodiment of the disclosure include additional securing components that are configured to mate with existing substrate retainers and/or actuation linkages to insure the integrity of the system under increased loads due to biasing, and to increase the reliability of actuation linkages generally, whether biased or non-biased. In some embodiments, the securing components are designed to require imposition of a lateral force (such as by a prying tool) in order to become detached. Because the actuation linkage does not experience substantial lateral forces in operation, the securing components do not become dislodged by the biasing forces or the normal forces of operation, which act axially rather than laterally.

Various embodiments of the disclosure also reduce the torque requirements for installation of a door assembly into the container portion. Conventional SMIF pods can also require in excess of 7 inch-pounds (in-lbf) of torque to latch and unlatch a door from the dome. A spring-loaded arrangement is disclosed that provides a force assist to the actuation of the door latch that reduces attendant torque requirements when latching and unlatching the door assembly from the dome. For example, tests have demonstrated that, during the latching operation of the door assembly within the dome, the torque requirements for the latching operation are reduced by more than 50%.

Structurally, in various embodiments of the disclosure, a substrate container is disclosed, including a container portion including a door frame defining an opening and a door configured to mount within the door frame. An actuation linkage assembly includes a frame, a substrate retainer assembly, and a spindle, the spindle being pivotally mounted to the frame and to the substrate retainer assembly, the frame being mounted to an interior wall of the container portion, the substrate retainer assembly being extendible into the opening of the door frame. The actuation linkage assembly is selectively configurable in a substrate retention position wherein the substrate retainer assembly is in contact with and actuated by the door when the door is seated within the door frame. The actuation linkage assembly is also selectively configurable in a substrate non-retention position wherein the substrate retainer assembly extends into the opening of the door frame when the door is absent from the door frame. A biasing member operatively coupled to at least one of the frame, the spindle, and the substrate retainer assembly, the biasing member biasing the actuation linkage assembly in the substrate non-retention position.

In various embodiments of the disclosure, a door for a substrate container is disclosed, including a front panel and a back panel that are joined to define an interior chamber. A latch cam is mounted to the door within the interior chamber and rotatable about a cam axis. A latch arm disposed within the interior chamber and operatively coupled to the latch cam. An arcuate spring includes a first end and a second end, the first end being pivotally coupled to the latch cam, the second end being pivotally coupled to the latch arm. The latch cam is rotatable from a first angular orientation where the door is in an unlatched configuration to a second angular orientation where the door is in a fully latched configuration. The arcuate spring is in maximum compression at an intermediate angular orientation that is between the first angular orientation and the second angular orientation.

In various embodiments of the disclosure, a substrate container is disclosed, including a container portion including a door frame defining an opening, and a door configured to mount within the door frame. The door includes: a front panel and a back panel that are joined to define an interior chamber; a latch cam mounted to the door within the interior chamber and rotatable about a cam axis, the latch cam being rotatable from a first angular orientation where the door is in an unlatched configuration to a second angular orientation where the door is in a latched configuration; a latch arm disposed within the interior chamber and operatively coupled to the latch cam, and an arcuate spring having a first end and a second end, the first end being pivotally coupled to the latch cam, the second end being pivotally coupled to the latch arm, the arcuate spring being in maximum compression at an intermediate angular orientation that is between the first angular orientation and the second angular orientation. In one or more embodiments, an actuation linkage assembly includes a frame, a substrate retainer assembly, and a spindle, the spindle being pivotally mounted to the frame and to the substrate retainer assembly, the frame being mounted to an interior wall of the container portion, the substrate retainer assembly being extendible into the opening of the door frame. In these embodiments, the actuation linkage assembly is selectively configurable in a substrate retention position wherein the substrate retainer assembly is in contact with and actuated by the door when the door is seated within the door frame. Also in these embodiments, the actuation linkage assembly is selectively configurable in a substrate non-retention position wherein the substrate retainer assembly extends into the opening of the door frame when the door is absent from the door frame. A biasing member is operatively coupled to at least one of the frame, the spindle, and the substrate retainer assembly, the biasing member biasing the actuation linkage assembly in the substrate non-retention position.

In various embodiments of the disclosure, a method for retaining substrates within a substrate carrier, includes configuring an actuation linkage assembly within the substrate carrier in a substrate retention position for selectively retaining substrates within the substrate carrier, and biasing the actuation linkage assembly in a substrate non-retention position when the actuation linkage assembly is in the substrate retention position.

In various embodiments of the disclosure, a container portion includes a door frame defining an opening, a door configured to mount within the door frame, and an actuation linkage assembly. The actuation linkage assembly includes a frame mounted to an interior wall of the container portion, a spindle pivotally mounted to the frame, a substrate retainer assembly pivotally mounted to the spindle, the substrate retainer assembly being extendible into the opening of the door frame. A wheel and axle may be mounted to a lower end of the substrate retainer assembly, the axle being retained to the substrate retainer assembly by a clip-in structure defined at the lower end of the substrate retainer assembly. In some embodiments, a wheel retention clip is mounted to the substrate retainer assembly and configured to prevent the axle from being released from the substrate retainer assembly, the actuation linkage assembly being selectively configurable in a substrate retention position wherein the substrate retainer assembly is in contact with the wheel and actuated by the door when the door is seated within the door frame, the wheel being configured to roll along an interior surface of the door.

In some embodiments, the wheel retention clip includes a plurality of hook portions that couple with the substrate retainer assembly to secure the wheel retention clip to the substrate retainer assembly. The substrate retainer assembly may include a base that defines an aperture. In some embodiments, at least one of the plurality of hook portions of the wheel retention clip are coupled to a perimeter of the aperture. The wheel retention clip may include registration structures for registering the wheel retention clip within the aperture. In some embodiments, a wheel yoke is disposed at the lower end of the substrate retainer assembly, the wheel and axle being mounted to the wheel yoke. In some embodiments, the clip-in structure of the substrate retainer assembly includes a resilient cantilever that exerts a biasing force against the axle to retain the axle within the wheel yoke, and the wheel retention clip is configured to prevent the resilient cantilever of the clip-in structure from deflecting, thereby preventing the clip-in structure from releasing the axle. In various embodiments, at least one of the plurality of hook portions of the wheel retention clip are coupled with the wheel yoke. The wheel retention clip may also be configured to resiliently displace the at least one of the plurality of hook portions about the wheel yoke and to clip on to the wheel yoke in assembly. In some embodiments, at least one of the plurality of hook portions coupled to the wheel yoke include a lead-in structure for sliding over the wheel yoke during assembly.

In various embodiments of the disclosure, a substrate container includes a container portion including a door frame defining an opening, a door configured to mount within the door frame, and an actuation linkage assembly. In some embodiments, the actuation linkage includes a frame mounted to an interior wall of the container portion, a spindle having a proximal side pivotally mounted to the frame and a distal side that includes a pivot shaft, and a substrate retainer assembly extendible into the opening of the door frame and pivotally mounted to the pivot shaft of the spindle, the substrate retainer assembly defining a recess within which the pivot shaft is rotatable relative to the substrate retainer assembly. In some embodiments, a pivot locking clip that mounts to the substrate retainer assembly to capture the pivot shaft between the substrate retainer assembly and the pivot locking clip. The pivot locking clip may include a plurality of hook portions that couple with the substrate retainer assembly to secure the pivot locking clip to the substrate retainer assembly. In some embodiments, the substrate retainer assembly includes an axially-extending portion that defines the recess, the axially-extending portion defining opposed axially-extending edges, with least some of the plurality of hook portions of the pivot locking clip being coupled to the opposed axially-extending edges of the axially-extending portion.

The pivot locking clip may include an arcuate body portion including opposing ends, and a first pair of hook portions extending from a first end of the arcuate body portion, wherein the first pair of hook portions are coupled to the substrate retainer assembly to secure the arcuate body portion against the pivot shaft of the spindle. In some embodiments, the substrate retainer assembly includes an axially-extending portion that defines the recess, the axially-extending portion defining opposed axially-extending edges. The first pair of hook portions are configured to engage the opposed axially-extending edges of the axially-extending portion. The first pair of hook portions may be configured for resilient displacement about the axially-extending portion of the substrate retainer assembly and to clip on to the axially-extending portion in assembly. Also, the first pair of hook portions may include lead-in structures configured to deflect the first pair of hook portions away from each other during assembly.

In some embodiments, the pivot locking clip includes a second pair of hook portions extending from a second end of the arcuate body portion, wherein the second pair of hook portions are coupled to the substrate retainer assembly to secure the arcuate body portion against the pivot shaft of the spindle. The second pair of hook portions may be configured to engage the opposed axially-extending edges of the axially-extending portion. As with the first pair of hook portions, the second pair of hook portions may be configured for resilient displacement about the axially-extending portion of the substrate retainer assembly and to clip on to the axially-extending portion in assembly. In some embodiments, each hook portion of the second pair of hook portions include lead-in structures configured to deflect the second pair of hook portions away from each other during assembly.

BRIEF DESCRIPTION OF THE DRAWINGS

FIG. 10 is an elevational view of the actuation linkage of FIGS. 8 and 9 in a substrate retention position according to an embodiment of the disclosure.

FIG. 11 is a perspective view of the actuation linkage in the substrate retention position of FIG. 10 according to an embodiment of the disclosure.

FIG. 26 is a bottom view of the wheel retention clip of FIGS. 17 and 18 installed on the substrate retainer assembly according to an embodiment of the disclosure.

FIG. 27 is a partial, forward perspective view of the wheel retention clip of FIGS. 17 and 18 installed on the substrate retainer assembly according to an embodiment of the disclosure.

FIG. 28 is a rearward perspective view of the pivot locking clip of FIGS. 17 and 18 in isolation according to an embodiment of the disclosure.

FIG. 29 is a forward perspective view of the pivot locking clip of FIGS. 17 and 18 in isolation according to an embodiment of the disclosure.

FIG. 30 is a side view of the pivot locking clip of FIGS. 17 and 18 in isolation according to an embodiment of the disclosure.

DETAILED DESCRIPTION OF THE DEPICTED EMBODIMENTS

Figure 1:
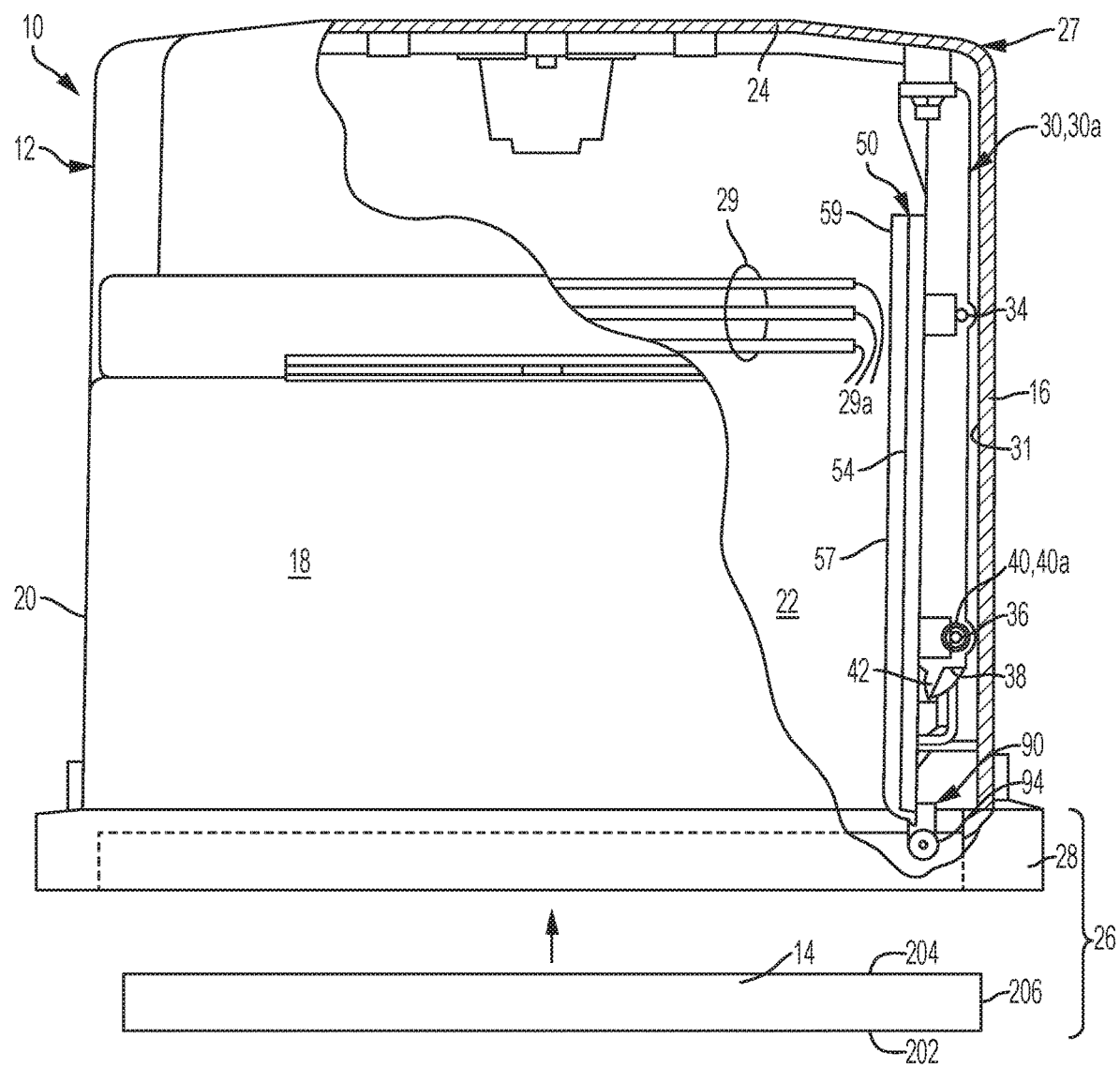
FIG. 1 is a cutaway side elevation view of a substrate container with an actuation linkage in a substrate non-retention position according to an embodiment of the disclosure.

Referring to FIGS. 1 through 6, a substrate container 10 is depicted according to an embodiment of the disclosure. The substrate container 10 includes a dome or container portion 12 with an actuation linkage assembly 30, 30a mounted thereto and a door assembly 14 for selectively affecting closure of the substrate container 10. The particular embodiment depicted is a bottom opening standard mechanical interface (SMIF) pod, with the container portion 12 being generally cubical in shape and having a front wall 20, a rear wall 16, two side walls 18 and 22, a top portion 24, and a bottom assembly 26. The bottom assembly 26 includes the door assembly 14 that may be seated within a door frame 28 of the container portion 12 to form an enclosure 27. A plurality of substrates 29 having edges 29*a* may be housed within the enclosure 27 and may be suspended by an H-bar carrier (not depicted).

The present disclosure discloses several embodiments of actuation linkage assemblies, which are referred to generically or collectively by the numerical reference 30 (e.g., actuation linkage assembly 30), and individually by the numerical reference 30 followed by a letter suffix (e.g., actuation linkage assembly 30*a*, as discussed above). The various actuation linkage assemblies 30 include many of the same components and attributes as actuation linkage assembly 30, which are indicated by like-numbered numerical references.

Figure 3:
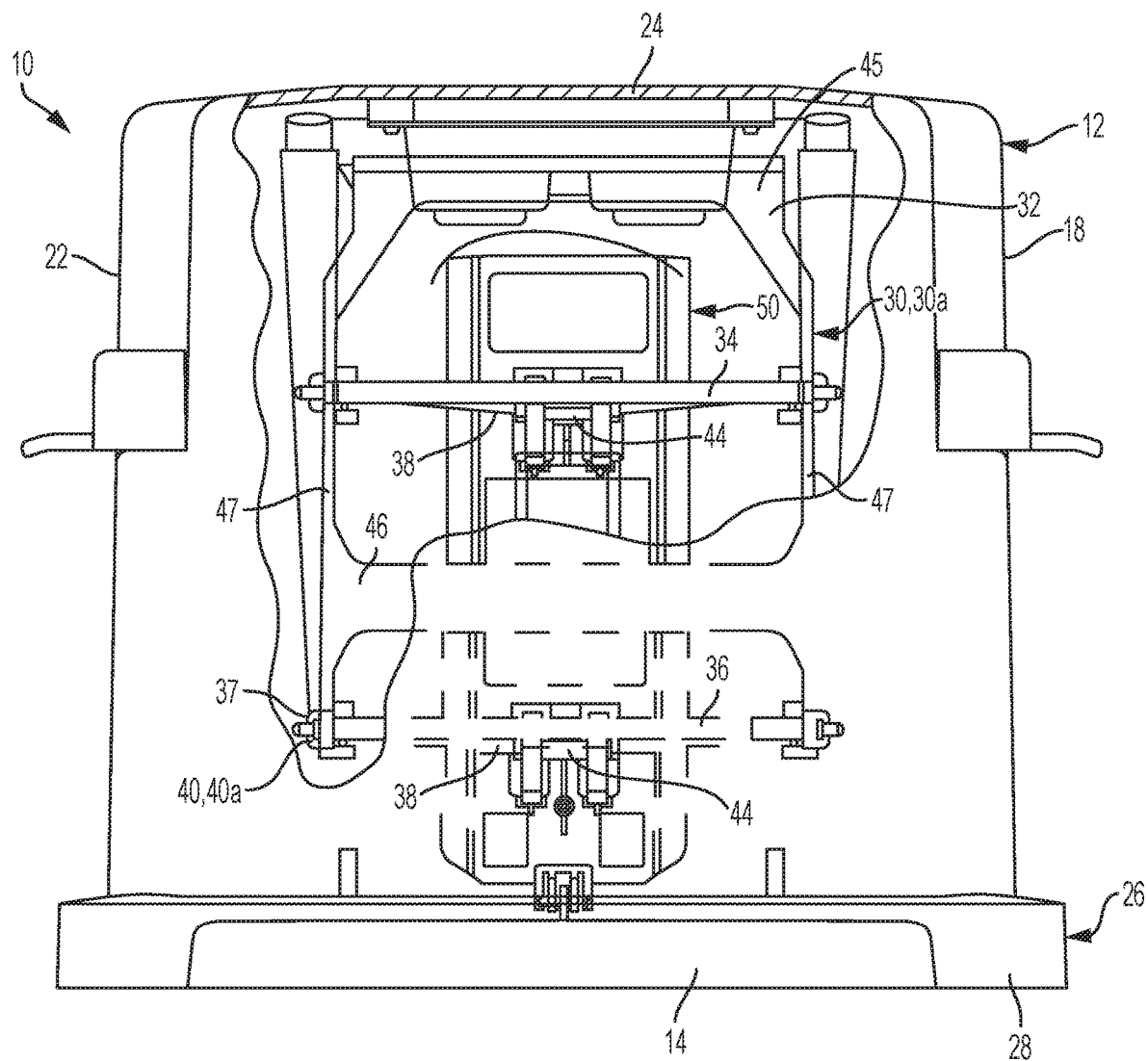
FIG. 3 is an elevation view of the substrate container of FIG. 1 with the rear wall cut away to expose the actuation linkage according to an embodiment of the disclosure.
Figure 4:
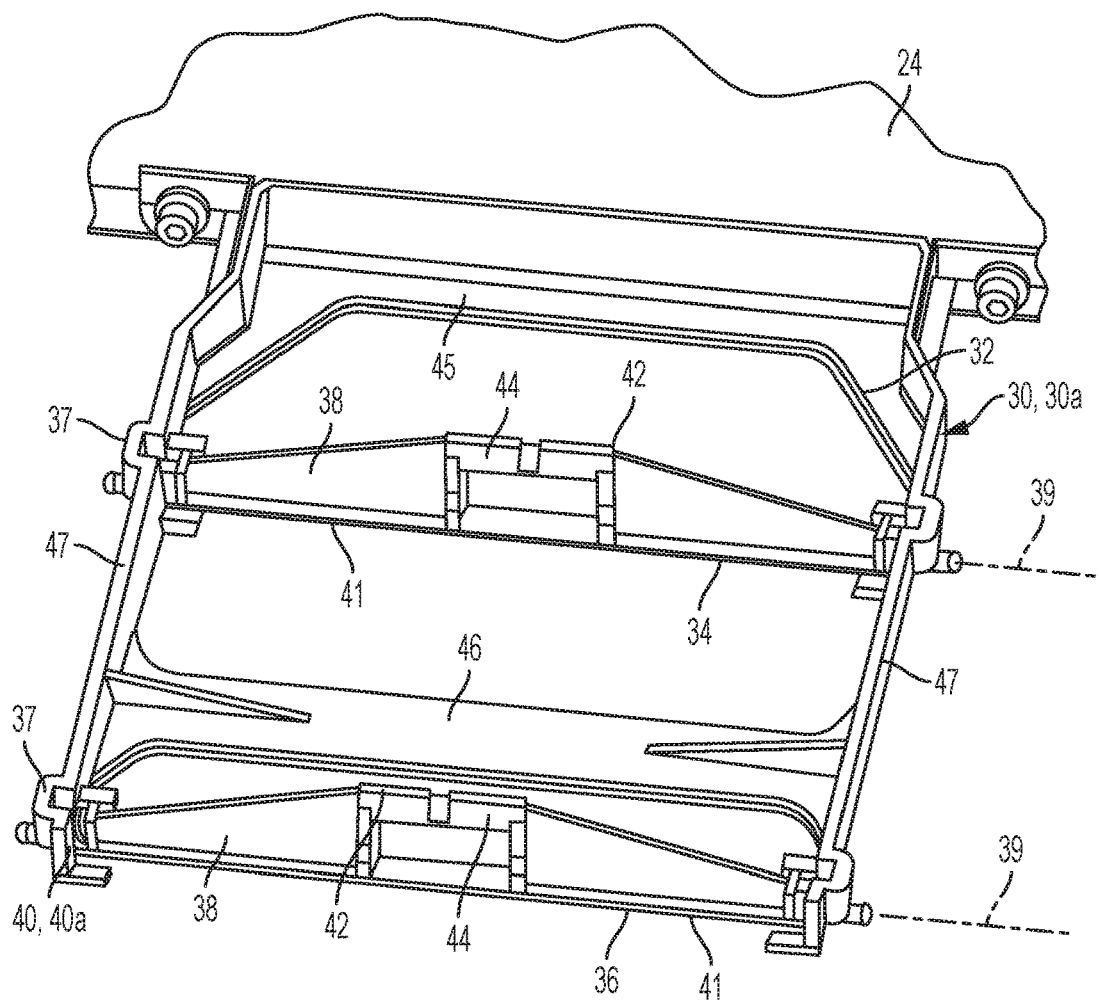
FIG. 4 is a perspective view of a frame, a pair of spindles, and a biasing member of the actuation linkage of in FIG. 1 according to an embodiment of the disclosure.
Figure 5:
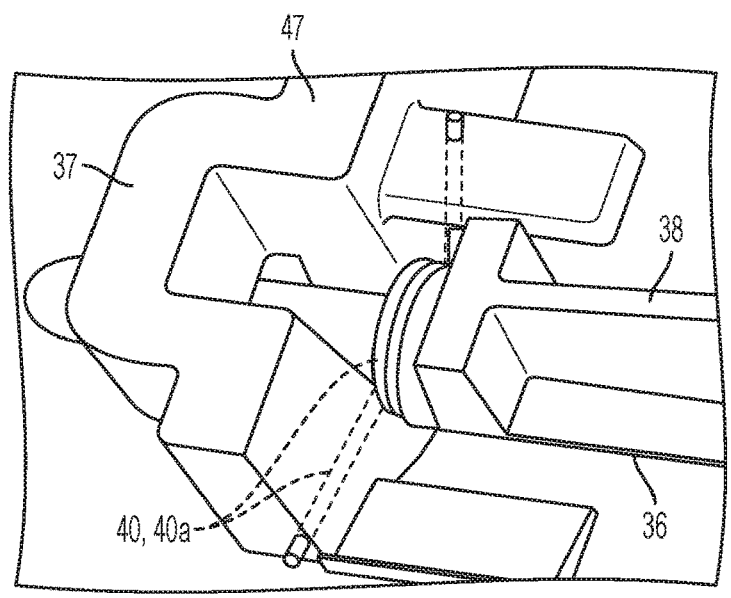
FIG. 5 is an enlarged, partial view of the biasing member of FIG. 4 according to an embodiment of the disclosure.

In the depicted embodiment, the actuation linkage assembly 30*a* depends from the top portion 24 proximate an interior surface 31 of the rear wall 16. Alternatively or in addition, the actuation linkage assembly 30*a* may be operatively coupled with one of the walls 16, 18, 20 or 22, or to the door assembly 14. The actuation linkage assembly 30*a* may include a frame 32 that includes an upper cross member 45 and a lower cross member 46 that separate a pair of side members 47 (FIGS. 3 and 4). The frame 32 supports an upper spindle 34 and a lower spindle 36 pivotally mounted to the frame 32 at pivot mounts 37 defined in the side members 47 of the frame 32. The pivot mounts 37 further define pivot or rotational axes 39 extending laterally through the frame 32. The upper spindle 34 and lower spindle 36 may each include a brace 38 extending therefrom, each brace 38 including a proximal side 41 and a distal side 42. The proximal side 41 is pivotally mounted to the frame 32. The distal sides 42 each support a cylindrical pivot shaft 44.

In certain embodiments, a biasing member 40 is operatively coupled to the frame 32 and the lower spindle 36. For the depicted embodiment of the actuation linkage assembly 30*a*, the biasing member 40 is a coil spring 40*a* connected to the lower spindle 36, the coil spring 40*a* being concentric about the rotational axis 39 of the lower spindle 36. In addition or in the alternative, the biasing member 40/coil spring 40*a* can be coupled to the upper spindle 34.

Herein the biasing members are referred to collectively or generically by numerical reference 40, and are identified individually by the numerical reference 40 follow by a letter suffix (e.g., coil spring 40*a*, as discussed above).

In various embodiments, the actuation linkage assembly 30*a* includes a substrate retainer assembly 50 including a base portion 54 and an engagement portion 56 operatively coupled with the cylindrical pivot shafts 44. The substrate retainer assembly 50 may include overmolded portions 57 to prevent chipping, pitting or abrasion due to contact with the substrates 29, such as described in International Publication No. WO 2007/146019 to Smith, et al., owned by the applicant of the present application, the disclosure of which is hereby incorporated by reference herein in its entirety except for express definitions and patent claims contained therein.

Figure 6:
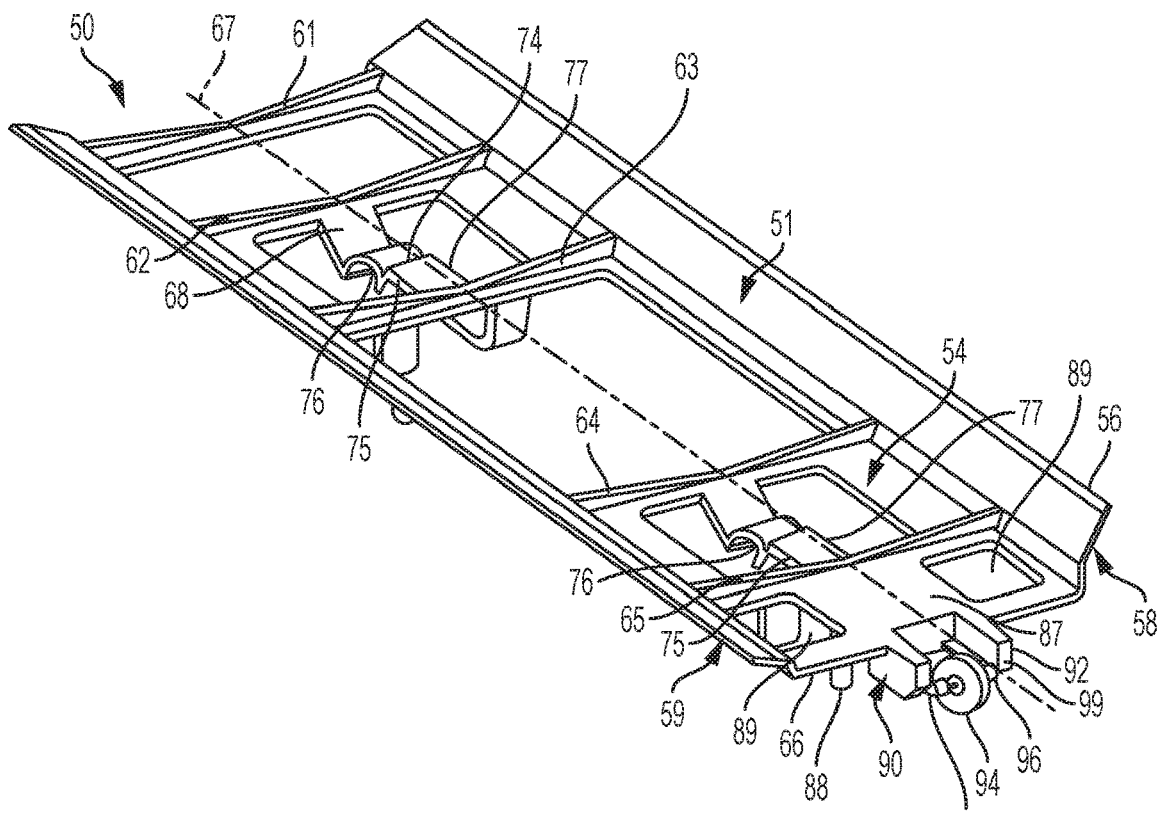
FIG. 6 is a perspective view of a substrate retainer assembly of FIG. 1 according to an embodiment of the disclosure.

The base portion 54 of the substrate retainer assembly 50 may include a pair of rail portions 58 and 59 separated by cross members 61 through 66 (FIG. 6). A central or longitudinal axis 67 is defined at the mid-span of the cross members 61-66. An upper clip assembly 68 may extend from cross members 62 and 63. An axially-extending portion 74, such as a central bridge member, may extend between the cross members 62 and 63, as well as between the cross members 64 and 65, and may define a recess 76 shaped to accommodate the cylindrical pivot shaft 44 when the substrate retainer assembly 50 is operatively coupled with the actuation linkage. Each axially-extending portion 74 may be characterized as having opposed axially-extending edges 75 and 77.

An axially-extending portion 87, such as a bridge plate extending between cross members 65 and 66, may cooperate with the rail portions 58 and 59 and the cross-members 65 and 66 to define a pair of apertures 89. A standoff 88 may project off the back side 51 of the substrate retainer assembly 50. The standoff 88 is depicted as extending from the cross member 65. More than one standoff member 88 may be utilized. A wheel yoke 90 having a free end 92 extends from cross member 66 along the central axis 67, with a wheel 94 and axle 96 operatively coupled with the wheel yoke 90. In this configuration, the axle 96 is mounted to the wheel yoke 90 proximate the free end 92, so that the outer radius of the wheel 94 protrudes beyond the free end 92 of the wheel yoke 90. In various embodiments, a clip-in structure 98 is defined at a lower end 99 of the substrate retainer assembly 50, the clip-in structure 98 is configured to retain the axle 96 to the substrate retainer assembly 50. In some embodiments, the clip-in structure 98 includes a resilient cantilever 101 that exerts a biasing force against the axle 96 to retain the axle 96 within the wheel yoke 90.

Figure 2:
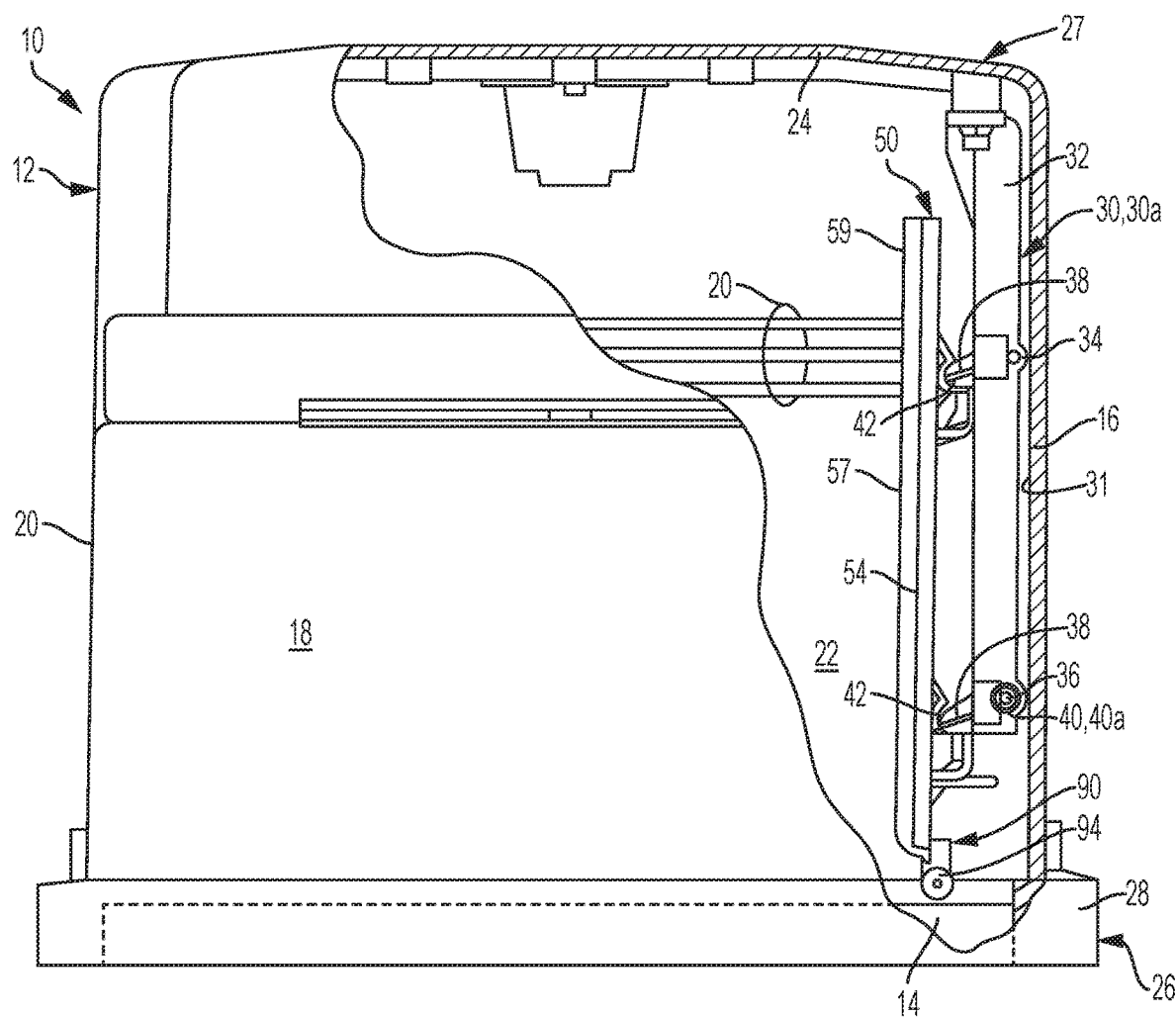
FIG. 2 is a cutaway side elevation view of the actuation linkage of FIG. 1 with the substrate retainer in a substrate retention position according to an embodiment of the disclosure.

In various embodiments, the actuation linkage assembly 30*a* is selectively configurable in a substrate retention position, as depicted in FIG. 2, wherein the substrate retainer assembly 50 is in contact with and actuated by the door assembly 14 when seated within the door frame 28. In this embodiment, the actuation linkage assembly 30*a* is also selectively configurable in a substrate non-retention position, as depicted in FIG. 1, wherein the substrate retainer assembly extends into an opening of the door frame 28 when the door assembly 14 is absent from the door frame 28.

Functionally, the biasing member 40 (coil spring 40*a*) acts to bias the actuation linkage assembly 30*a* in the non-retention position of FIG. 2. This biasing helps the actuation linkage assembly 30*a* to overcome any friction between the moving components so that the substrate retainer assembly 50 disengages from the substrates 29 upon removal of the door assembly 14 from the substrate container 12.

Figure 7:
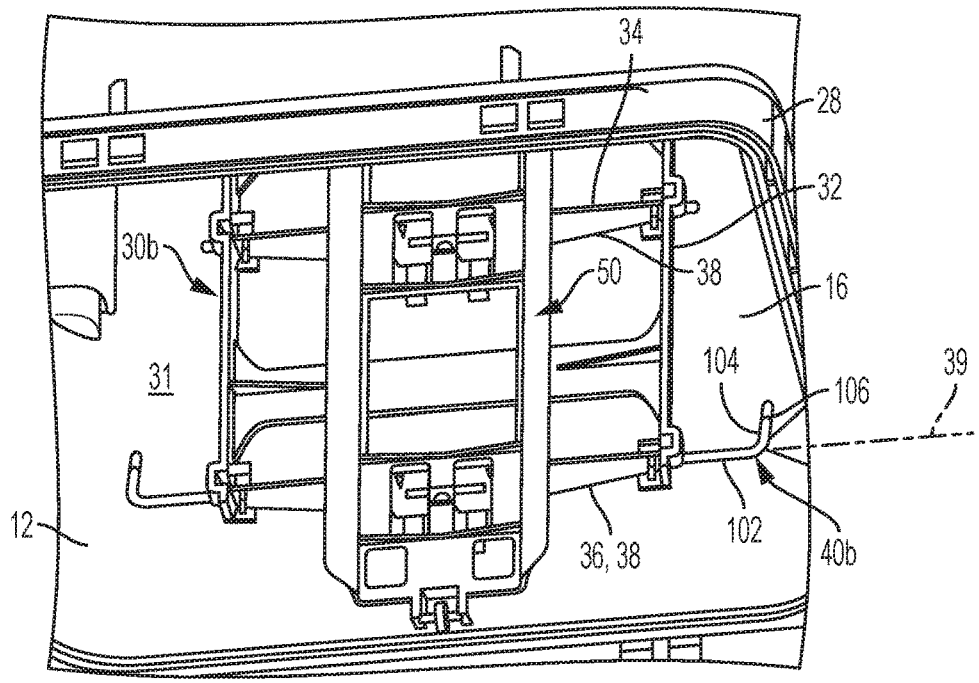
FIG. 7 is a perspective view of an actuation linkage with a biasing member that extends laterally from a spindle of an actuation linkage according to an embodiment of the disclosure.

Referring to FIG. 7, an actuation linkage assembly 30*b* is depicted according to an embodiment of the disclosure. The actuation linkage 30*b* includes a biasing member 40*b* that includes an extended portion 102 of the lower spindle 36 that extends laterally beyond the pivot mount 37, the extended portion 102 including a rotational stop 104 at a distal end 106. In the depicted embodiment, the extended portion 102 extends laterally beyond the frame 32 so that the rotational stop 104 engages the interior surface 31 of the rear wall 16. The extended portion 102 may extend laterally along the pivot axis 39 as depicted in FIG. 7.

In various embodiments, the rotational stop 104 is arranged extend perpendicular to the pivot axis 39, and in a plane parallel to the brace 38 to bias actuation linkage 30*b*. Accordingly, the actuation linkage assembly 30*b* is biased in the substrate non-retention configuration.

Functionally, upon seating the door assembly 14 within the door frame 28, the substrate retention assembly 50 rotates and translates into the substrate container 10, causing the lower spindle 36 to rotate while the rotational stop 104 prevents rotation of the distal end 106 of the extended portion 102 of the lower spindle 36. The differential rotation along the lower spindle 36 creates a torsion, at least when the door assembly 14 is seated within the door frame 28. The torsion creates a biasing torque that biases the actuation linkage assembly 30*b* towards the substrate non-retention configuration, but that is overcome by the seating of the door assembly 14 within the door frame 28. Upon unseating of the door assembly 14 from the door frame 28, the biasing torque causes the actuation linkage assembly 30*b* to return to the substrate non-retention configuration.

An embodiment wherein the rotational stop 104 engages the frame 32 instead of the interior surface 31 is also contemplated. Also, it is understood that the contacting interior surface is not limited to the interior surface 31 of the rear wall 16, but may be any interior surface positioned adjacent the rotational stop 104. Furthermore, embodiments where a biasing member 40*b* extends from the upper spindle 34 are also contemplated.

Referring to FIGS. 8 through 11, an actuation linkage assembly 30*c* is depicted according to an embodiment of the disclosure. A biasing element 40*c* of the actuation linkage 30*c* includes a pair of spring arms 122 that extend from the frame 32 to contact the brace 38 of the upper spindle 34. In the depicted embodiment, the spring arm 122 slidably contacts the upper spindle 34 as the actuation linkage assembly 30*c* is moved from the substrate non-retention configuration (FIGS. 8 and 9) to the substrate retention configuration (FIGS. 10 and 11). Herein, to "slidably contact" is to enable a first component to remain in contact with a second component as the second component moves relative to the first component, such that the second component slides over a surface of the first component. The spring arm 122 may be formed generally parallel to the frame 32, which is depicted in phantom in FIG. 8.

Figure 12:
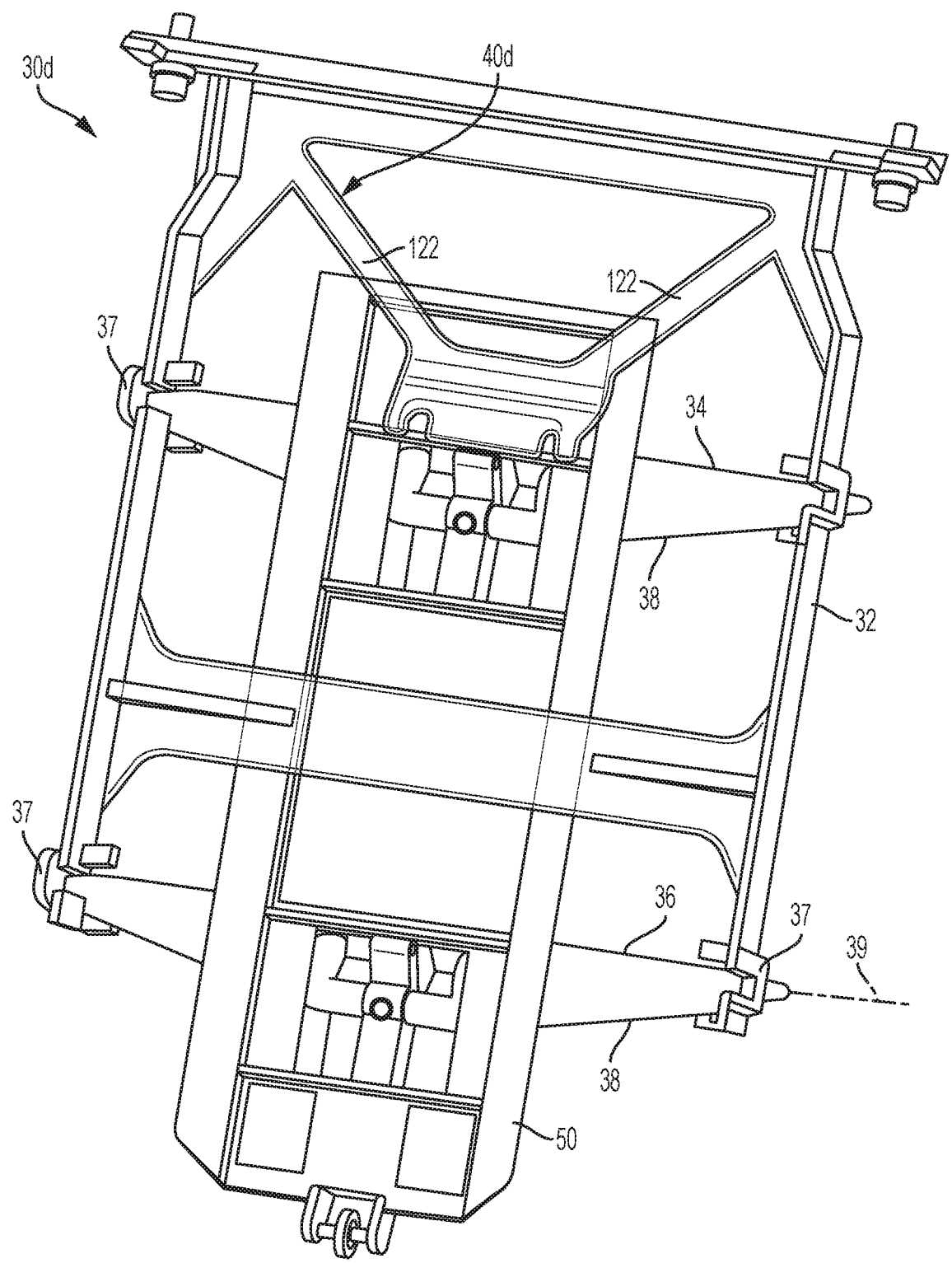
FIG. 12 is a perspective view of an actuation linkage in a substrate non-retention position with a biasing member that includes a spring arm that contacts a substrate retainer assembly of an actuation linkage according to an embodiment of the disclosure.
Figures 13, 14:
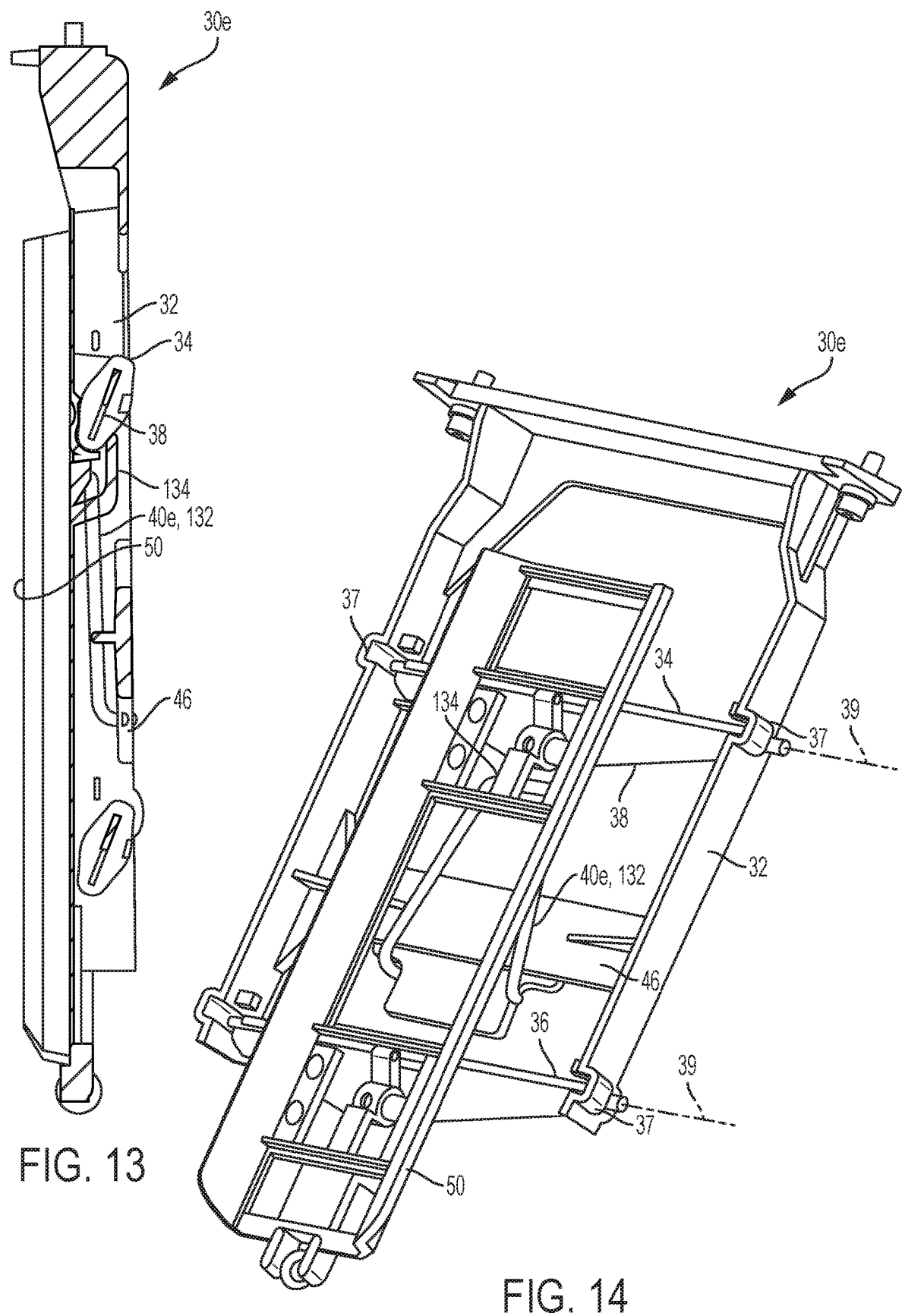
FIG. 13 is an elevational view of an actuation linkage in a substrate non-retention position with a biasing member that includes an elastic member according to an embodiment of the disclosure.
FIG. 14 is a perspective view of the actuation linkage in the substrate non-retention position of FIG. 13 according to an embodiment of the disclosure.

Referring to FIG. 12, an actuation linkage assembly 30*d* is depicted according to an embodiment of the disclosure. A biasing element 40*d* of the actuation linkage 30*d* also includes a pair of spring arms 122 that extend from the frame 32. However, for the actuation linkage assembly 30*d* and biasing element 40*d*, the spring arms 122 extend toward and are connected to the substrate retainer assembly 50.

Figures 8, 9:
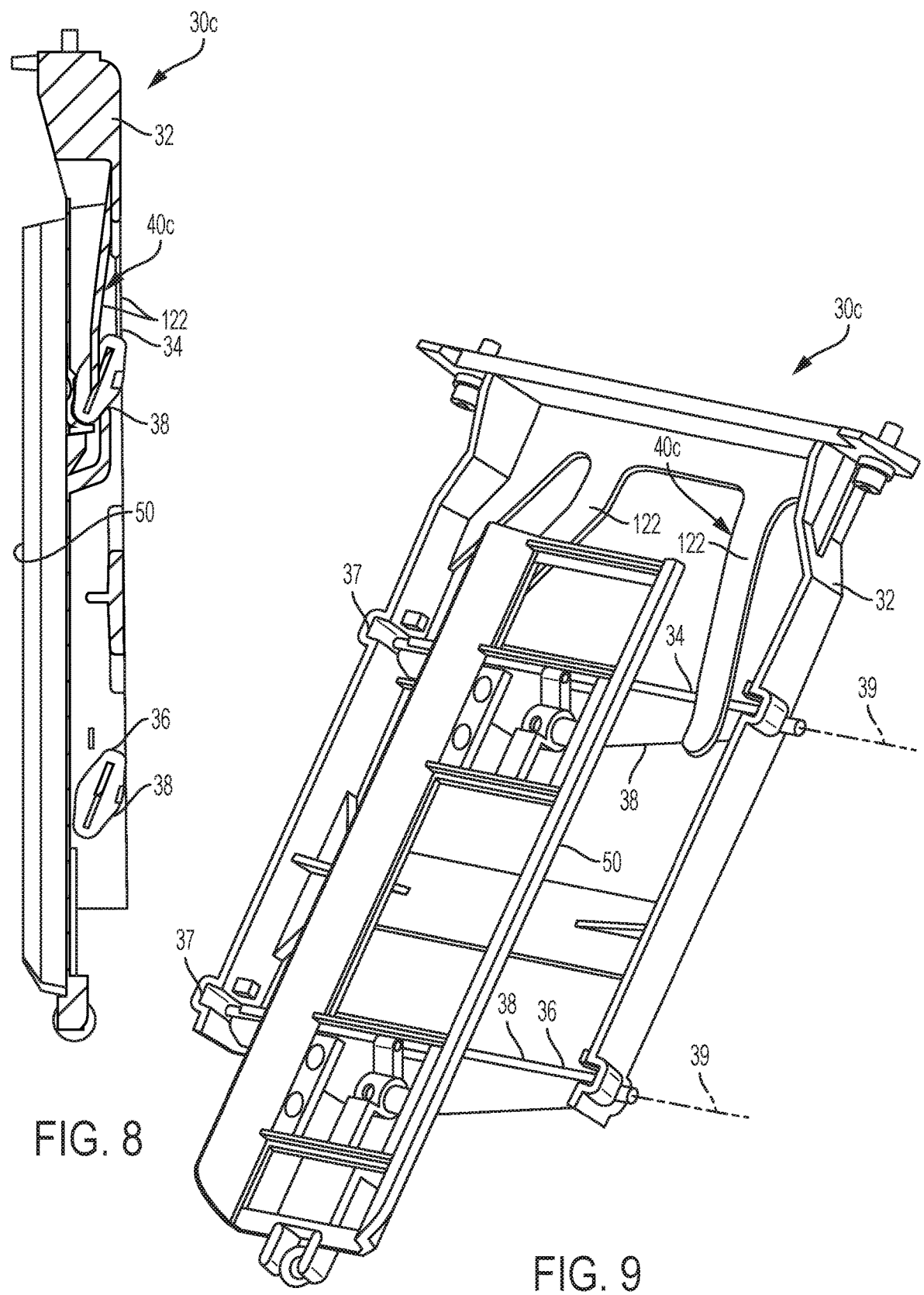
FIG. 8 is an elevational view of an actuation linkage in a substrate non-retention position with a biasing member that includes a spring arm that slidably contacts a spindle of an actuation linkage according to an embodiment of the disclosure.
FIG. 9 is a perspective view of the actuation linkage in the substrate non-retention position of FIG. 8 according to an embodiment of the disclosure.

Functionally, for both the actuation linkage assemblies 30*c* and 30*d*, the spring arms 122 of the biasing members 40*c* and 40*d*, are elastically displaced by the brace 38 of the upper spindle 34. The elastic displacement exerts a biasing force on the upper spindle 34 or the substrate retainer assembly 50 to bias the upper spindle 34 or substrate retainer assembly 50 toward the frame 32. The biasing force is overcome by the force exerted by the door assembly 14 on the substrate retainer assembly 50 by the seating of the door assembly 14 within the door frame 28. This biasing force effectively biases the actuation linkage assemblies 30*c* and 30*d* in the substrate non-retention configuration (FIGS. 8, 9, and 12).

Embodiments utilizing a single spring arm 122 or more than two spring arms 122 for the actuation linkage assemblies 30*c* or 30*d* are also contemplated. Furthermore, embodiments where a biasing member 40*c* or 40*d* acts on the lower spindle 36 are also contemplated.

Referring to FIGS. 13 through 16, an actuation linkage assembly 30*e* is depicted according to an embodiment of the disclosure. A biasing element 40*e* of the actuation linkage 30*e* includes a continuous elastic band 132 that extends from the frame 32 to the substrate retainer assembly 50. In the depicted embodiment, the continuous elastic band 132 is connected to the lower cross member 46 of as the frame 32. Also in this embodiment, the substrate retainer assembly 50 includes mounting structure 134 for mounting of the continuous elastic band 132.

Figures 15, 16:
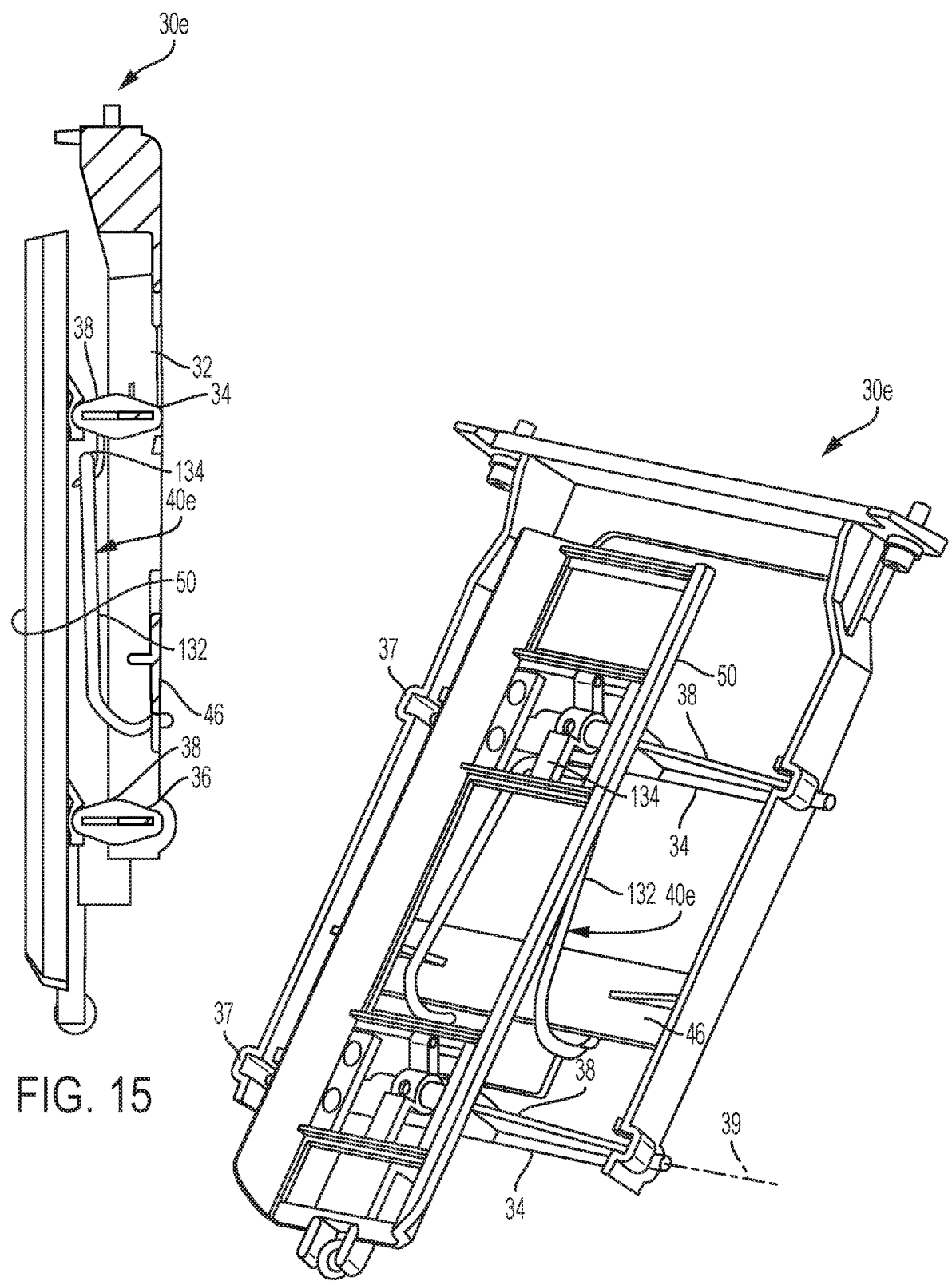
FIG. 15 is an elevational view of the actuation linkage of FIGS. 13 and 14 in a substrate retention position according to an embodiment of the disclosure.
FIG. 16 is a perspective view of the actuation linkage in the substrate retention position of FIG. 15 according to an embodiment of the disclosure.

Functionally, as the actuation linkage assembly 30*e* is moved from the substrate non-retention configuration (FIGS. 13 and 14) to the substrate retention configuration (FIGS. 15 and 16), the continuous elastic member 132, being elastically displaced, exerts a biasing force to bias the substrate retainer assembly 50 toward the frame 32, which is overcome by the force exerted by the door on the substrate retainer assembly 50 by the seating of the door assembly 14 within the door frame 28. This biasing force effectively biases the actuation linkage assembly 30*e* in the substrate non-retention configuration (FIGS. 15 and 16).

Embodiments utilizing a non-continuous elastic member, as well as embodiments utilizing a plurality of elastic members (continuous or non-continuous), are also contemplated. Furthermore, embodiments where a biasing member 40*e* acts on one or more of the spindles 34, 36 instead of the substrate retainer assembly 50 and/or is coupled to the frame at locations other than the lower cross member 46 is also contemplated.

Figure 17:
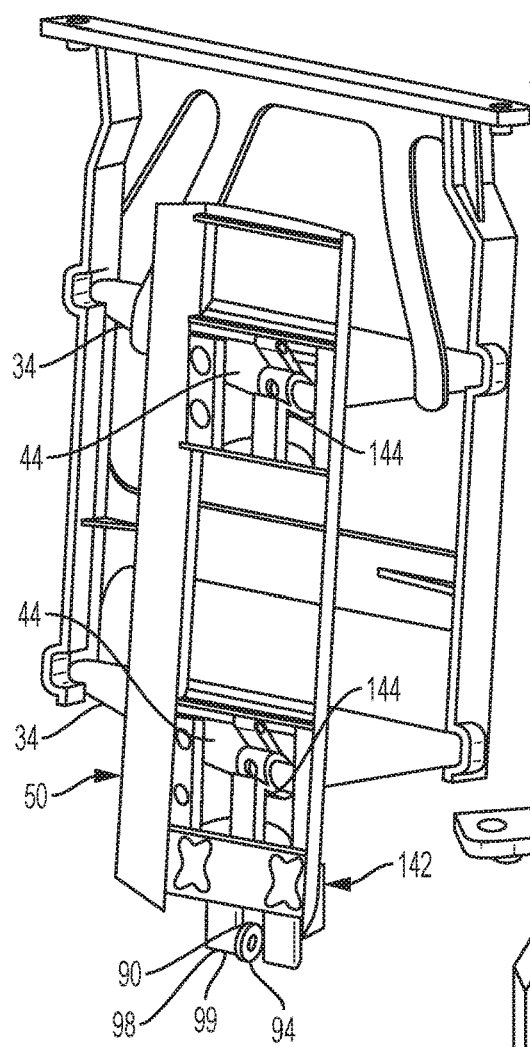
FIG. 17 is a forward perspective view of an actuation linkage in a substrate non-retention position with a wheel retention clip and a pair of pivot locking clips according to an embodiment of the disclosure.
Figure 18:
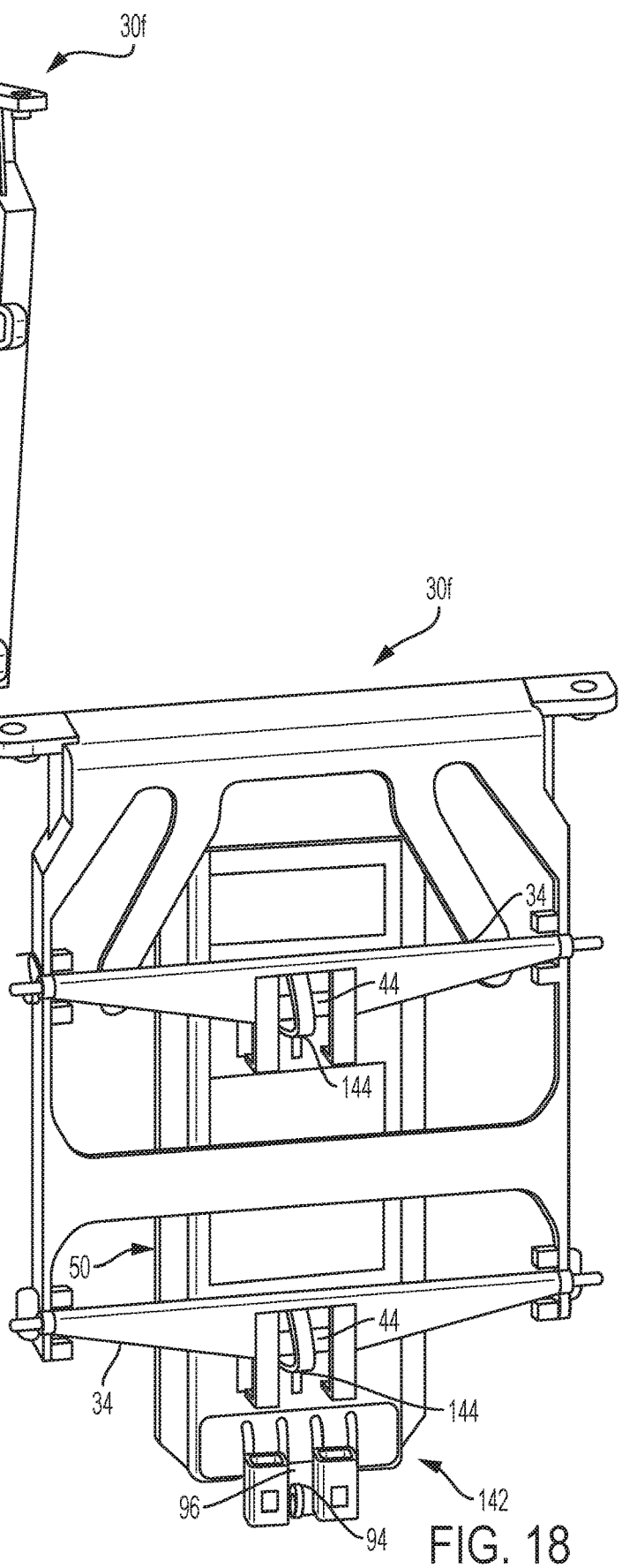
FIG. 18 is a rearward perspective view of the actuation linkage of FIG. 17.
Figure 20:
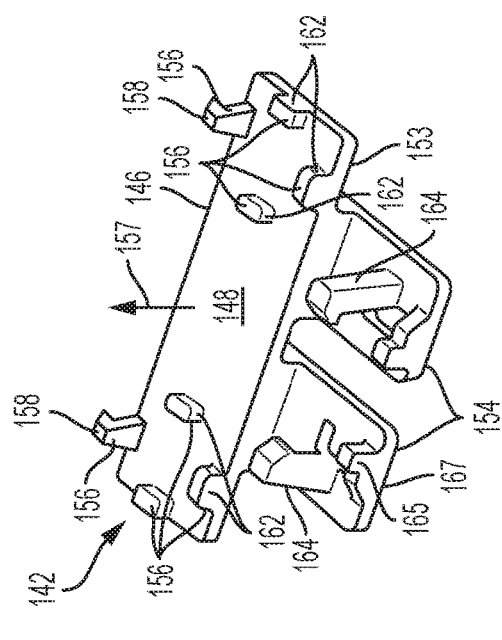
FIG. 20 is a forward perspective view of the wheel retention clip FIGS. 17 and 18 in isolation according to according to an embodiment of the disclosure.
Figure 19:
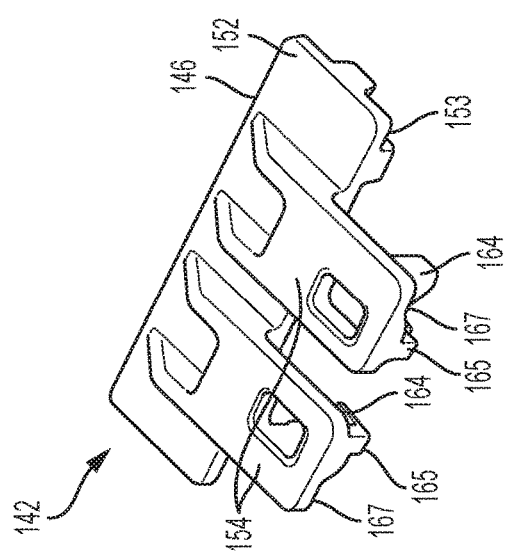
FIG. 19 is a rearward perspective view of the wheel retention clip of FIGS. 17 and 18 in isolation according to an embodiment of the disclosure.
Figure 22:
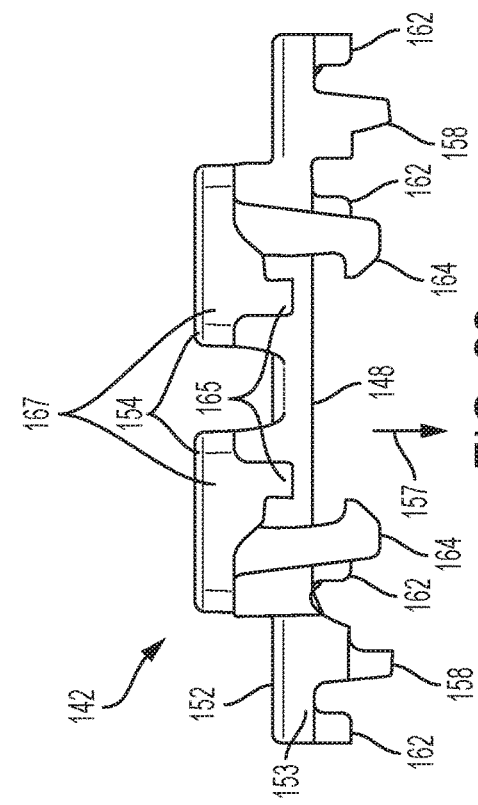
FIG. 22 is a top view of the wheel retention clip FIGS. 17 and 18 in isolation according to an embodiment of the disclosure.
Figure 21:
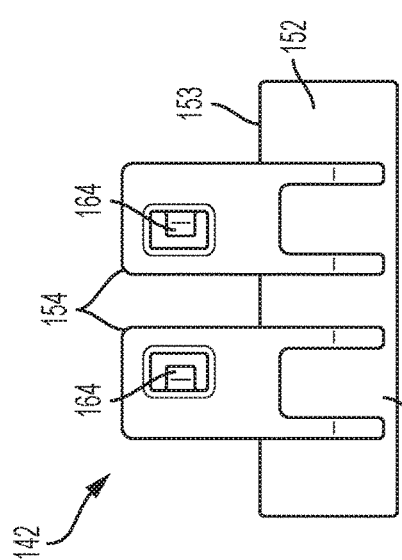
FIG. 21 is a rearward elevational view of the wheel retention clip of FIGS. 17 and 18 in isolation according to an embodiment of the disclosure.
Figure 23:
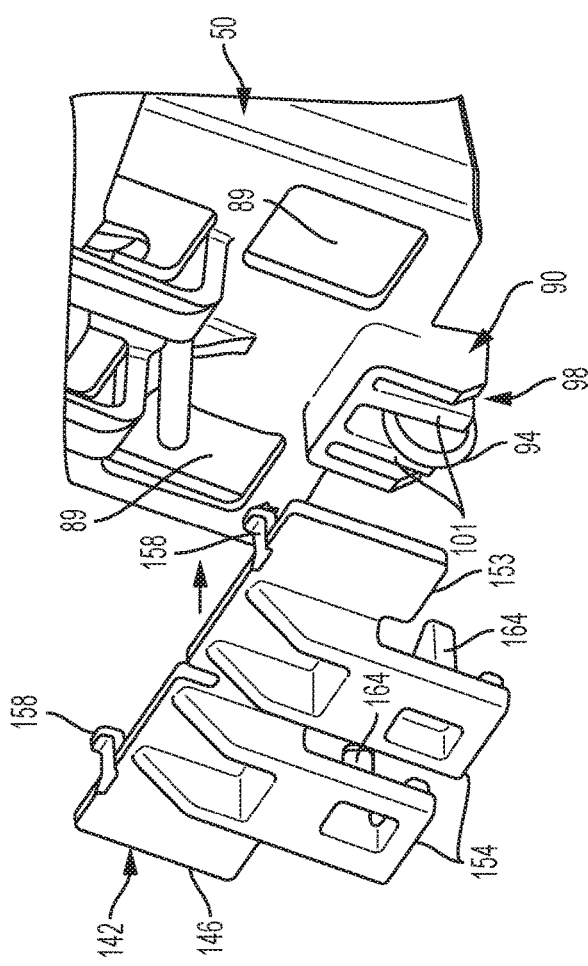
FIG. 23 is a rearward perspective view of the wheel retention clip of FIGS. 17 and 18 being aligned with a substrate retainer assembly according to an embodiment of the disclosure.
Figure 25:
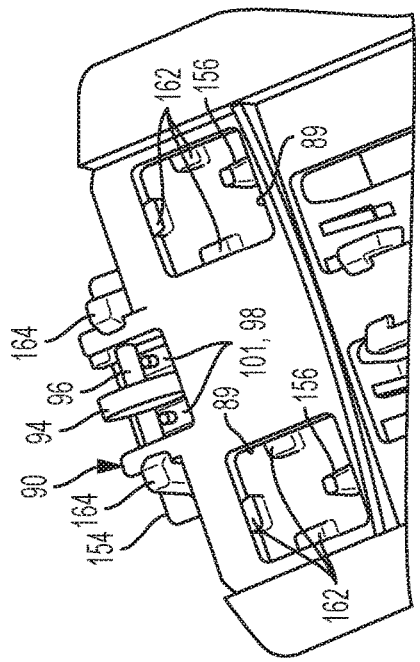
FIG. 25 is a partial, forward perspective view of the wheel retention clip of FIGS. 17 and 18 installed on the substrate retainer assembly according to an embodiment of the disclosure.
Figure 24:
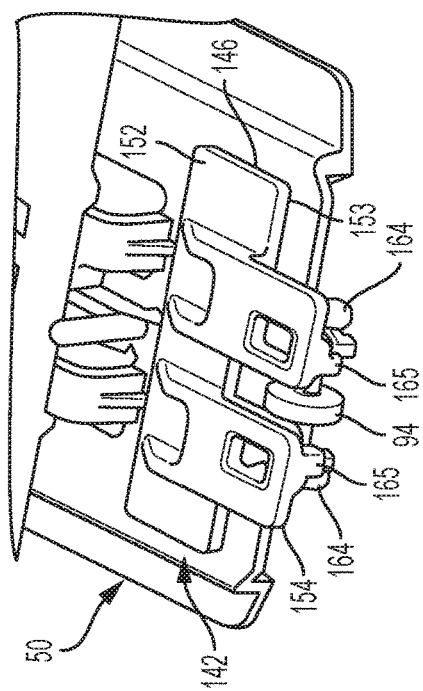
FIG. 24 is a partial, rearward perspective view of the wheel retention clip of FIGS. 17 and 18 installed on the substrate retainer assembly according to an embodiment of the disclosure.
Figure 32:
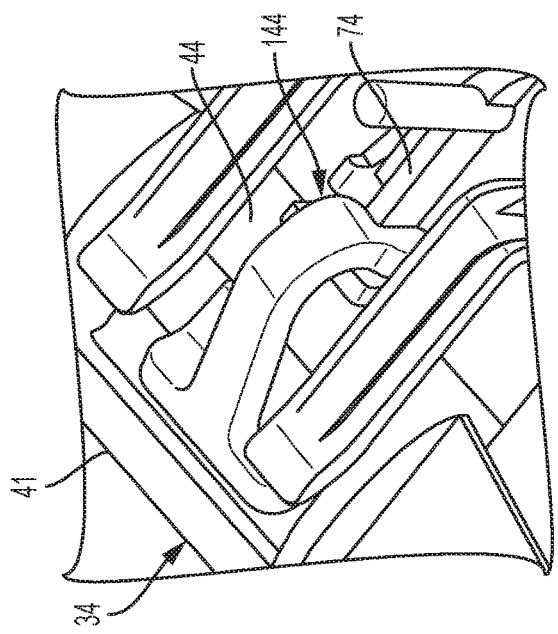
FIG. 32 is a partial, rearward perspective view of the wheel retention clip of FIGS. 17 and 18 installed on the substrate retainer assembly and spindle according to an embodiment of the disclosure.
Figure 34:
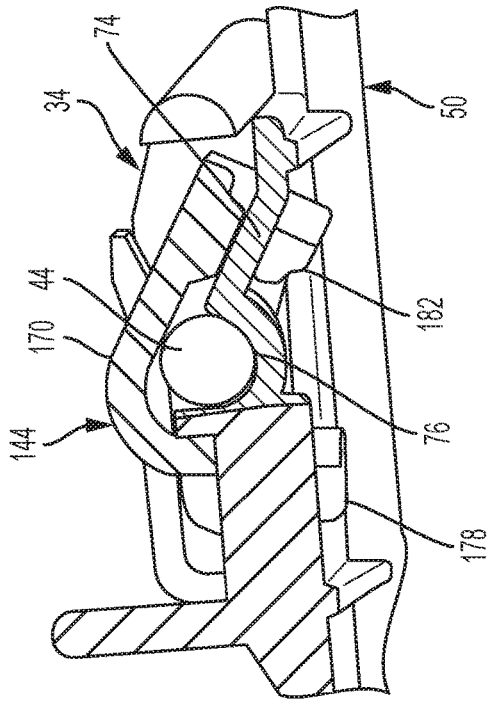
FIG. 34 is a partial, cross-sectional view of the wheel retention clip of FIGS. 17 and 18 installed on the substrate retainer assembly according to an embodiment of the disclosure.
Figure 31:
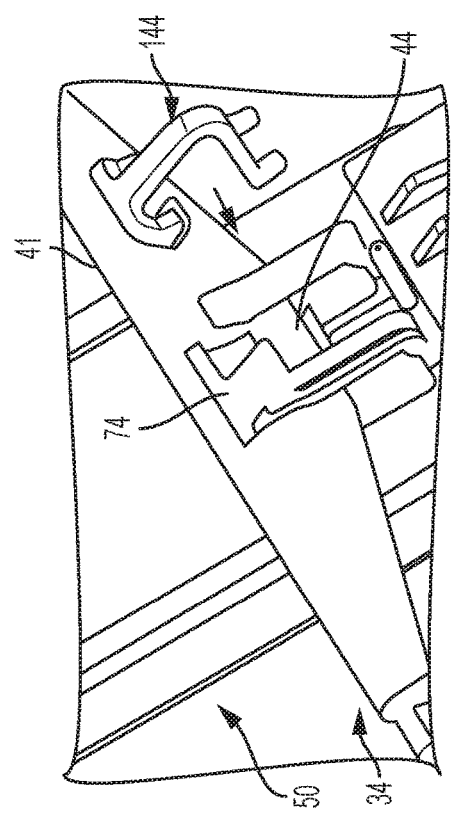
FIG. 31 is a partial, rearward perspective view of the pivot locking clip of FIGS. 17 and 18 being aligned with a substrate retainer assembly and spindle according to an embodiment of the disclosure.
Figure 33:
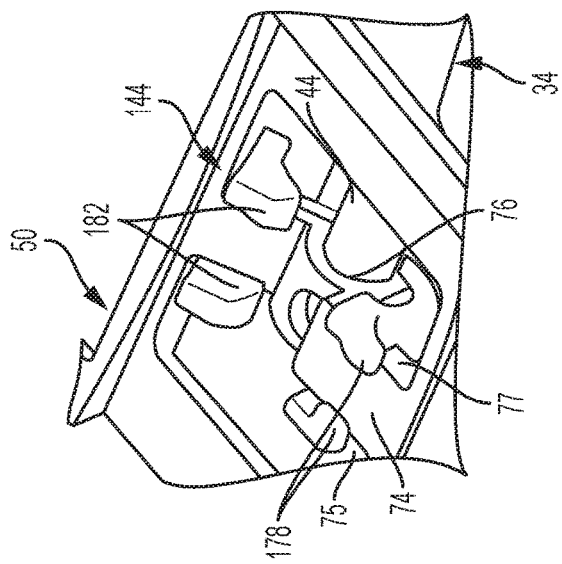
FIG. 33 is a partial, forward perspective view of the wheel retention clip of FIGS. 17 and 18 installed on the substrate retainer assembly and spindle according to an embodiment of the disclosure.

Referring to FIGS. 17 and 18, an actuation linkage assembly 30*f* is depicted according to an embodiment of the disclosure. The actuation linkage assembly 30*f* includes many of the same components and attributes as actuation linkage assembly 30*c*, which are indicated with same-numbered numerical references. In addition, the actuation linkage assembly 30*f* includes a wheel retention clip 142 and a pivot locking clip 144. The wheel retention clip 142 is mounted to the substrate retainer assembly 50 and configured to prevent the clip-in structure 98 from inadvertently releasing the axle 96. The pivot locking clip 144 is mounted to the substrate retainer assembly 50 to capture the cylindrical pivot shaft 44 between the substrate retainer assembly 50 and the pivot locking clip 144, thereby locking the substrate retainer assembly 50 to the cylindrical pivot shaft 44 of the respective spindle 34. While the actuation linkage assembly 30*f* includes many of the same components and attributes as actuation linkage assembly 30*c*, the wheel retention clip 142 and the pivot locking clip 144 may be implemented with any of the linkage assemblies 30 of the disclosure.

Referring to FIGS. 19 through 22, the wheel retention clip 142 is depicted according to an embodiment of the disclosure. The wheel retention clip 142 includes a plate portion 146 having an inner mounting face 148 and an outer face 152 opposite the inner mounting face 148. A pair of arm portions 154 extend from the outer face 152 and beyond a bottom edge 153 of the plate portion 146. The inner mounting face 148 may include a plurality of features 156 extending in a direction 157 that is perpendicular to the inner mounting face 148, the features 156 including hook portions 158 and registration structures 162. Each arm portion 154 includes a hook portion 164 that also extend in the direction 157. In some embodiments, each arm portion 154 includes a stop structure 165 at a distal end 167.

Referring to FIGS. 23 through 27, installation of the wheel retention clip 142 is depicted according to an embodiment of the disclosure. In assembly, the features 156 of the inner mounting face 148 are aligned with the apertures 89 of the substrate retainer assembly 50. The wheel retention clip 142 is mounted to the substrate retainer assembly 50 so that each hook portion 158 extending from the plate portion 146 is coupled to a perimeter of a respective one of the apertures 89 of the substrate retainer assembly 50, and so that the registration structures 162 are disposed within the apertures 89. The arm portions 154 are arranged to straddle the wheel 94, and the hook portions 164 straddle and engage opposing sides of the wheel yoke 90.

In some embodiments, each hook portion 164 includes a lead-in structure 166 to facilitate sliding of the hook portion 164 over the opposing sides of the wheel yoke 90 during assembly. The lead-in structures 166 cause the hook portions 164 to deflect as they are slid over the wheel yoke 90. The deflection of the hook portions 164 are caused by resilient twisting of the arm portions 154, resilient bending of hook portions 164, or a combination thereof. Once mounting of the wheel retention clip 142 is complete, the resilience of the arm portions 154 and/or hook portions 164 cause the hook portions 164 to snap into place, thereby capturing the wheel yoke 90 between the hook portions 164.

Functionally, in the depicted embodiment, the wheel retention clip 142 prevents the wheel 94 and axle 96 from becoming inadvertently dislodged from the clip-in structure 98 of the substrate retainer assembly 50. In some embodiments, the securing of the axle 96 is accomplished by prohibiting deflection of the resilient cantilever portion 101 of the clip-in structure 98, so that the axle 96 cannot be released from the clip-in structure 98 unless the wheel retention clip 142 is removed. The wheel retention clip 142 is secured to the substrate retainer assembly 50 by the hook portions 158 of the plate portion 146 engaged at the perimeter of the apertures 89, and by the hook portions 164 clipped to the wheel yoke 90. The registration structures 162 help align the plate portion 146 with the apertures 89, and maintains stability and a substantially fixed relationship between the retention clip 142 and the substrate retainer assembly 50 when undergoing axial and/or lateral forces during operation. As depicted in FIGS. 26 and 27, the stop structures 165 cooperate with the wheel yoke 90 to provide additional capture of the axle 96.

Referring to FIGS. 28 through 30, the pivot locking clip 144 is depicted according to an embodiment of the disclosure. The pivot locking clip 144 includes a body portion 170 and a plurality of hook portions 172 that extend from the body portion 170. The body portion 170 includes opposing ends 174 and 176. In the depicted embodiment, the plurality of hook portions 172 includes a first pair of hook portions 178 extending from one of the opposing ends 174, and a second pair of hook portions 182 extending from the other of the opposing ends 176. The body portion 172 may be arcuate. In various embodiments, some or all of the plurality of hook portions 172 are configured with lead-in structures 184

Referring to FIGS. 31 through 34, assembly of the pivot locking clip 144 to the substrate retainer assembly 50 is depicted according to an embodiment of the disclosure. In assembly, the first pair of hook portions 178 are coupled to the substrate retainer assembly 50 to secure the body portion 172 against the cylindrical pivot shaft 44 of the spindle 34 or 36. In the depicted embodiment, the plurality of hook portions 172 are coupled to the opposed axially extending edges 75 and 77 of the axially-extending portion 74. Some or all of the plurality of hook portions 172 may be configured for resilient displacement about the axially-extending portion 74 of the substrate retainer assembly 52 for clipping on to the axially-extending portion 74.

Functionally, the plurality of hook portions 170 couple with the substrate retainer assembly 50 to secure the pivot locking clip 144 to the substrate retainer assembly 50, so that the cylindrical pivot shaft 44 of the respective spindle 34 or 36 is positively locked within the recess 76 of the axially-extending portion 74. The lead-in structures 184, when utilized, are configured to so that hook portions 170 of a given pair of hook portions 178 and 182 deflect away from each other as the pivot locking clip 144 is pressed onto the axially-extending portion 74 during assembly. The pivot locking clip 144 cannot be dislodged from axially-extending portion 74 by axial forces exerted on the wheel 94. Rather, removal of the pivot locking clip 144 from the axially-extending portion 74 requires outward lateral deflection of the first and/or second hook portion pairs 178 and 182, such as with a prying tool.

Referring to FIGS. 35 through 40D, the door assembly 14 is depicted according to an embodiment of the disclosure. The door assembly 14 includes a front panel 202 (FIG. 1) and a back panel 204. In various embodiments, the back panel 204 includes an outer perimeter portion 206; the outer perimeter portion 206 may also be formed as part of the front panel 202, or may be defined by the combination of the front panel 202 and back panel 204. The outer perimeter portion 206 also defines latch tip apertures 207 (FIG. 35) that pass through the outer perimeter portion 206. The front and back panels 202 and 204 are joined to define an interior chamber 208 of the door assembly 14.

Figure 37:
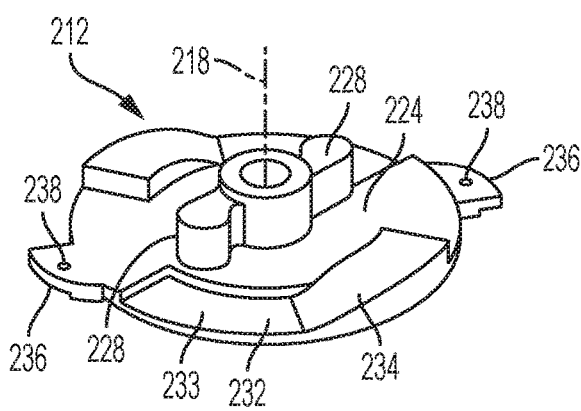
FIG. 37 is a perspective view of the opposing side of the latch cam of FIG. 36 according to an embodiment of the disclosure.
Figure 38:
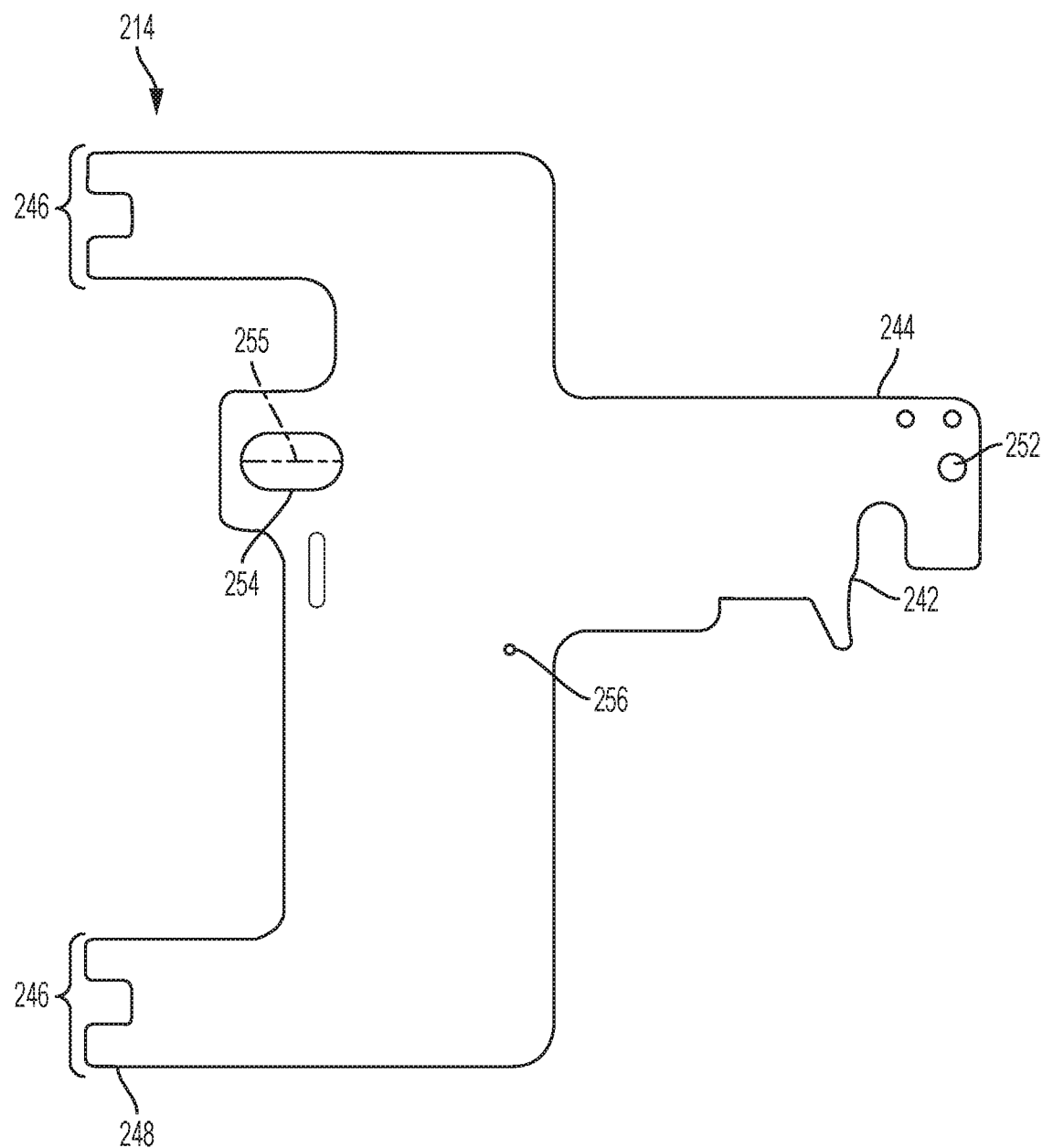
FIG. 38 is a plan view of a latch arm of FIG. 35 according to an embodiment of the disclosure.

The door assembly 14 includes a latch assembly 210. In various embodiments, the latch assembly 210 includes a latch cam 212, latch arms 214, and arcuate springs 216 connected to the latch cam 212 and latch arms 214. The latch cam 212 is mounted to the door assembly 14 within the interior chamber 208, rotatable about a cam axis 218. The latch cam 212 includes a front face 222 (FIG. 36) and a back face 224 (FIG. 37). The front face 222 may include key apertures 226 defined thereon, accessible through arcuate through-slots 227 (FIG. 41) formed on the front panel 202. In the depicted embodiment, the back face 224 includes lobes 228 concentrically disposed about the cam axis 218. The back face 224 may also include cammed surfaces 232 that define planar faces 233 that lead into ramped or inclined faces 234, the cammed surfaces 232 also being concentrically disposed about the cam axis 218. In some embodiments, the latch cam 212 also includes radially protruding tabs 236. Each of the radially protruding tabs 236 may define a mounting hole 238 through which the arcuate spring 216 is mounted.

Figure 35:
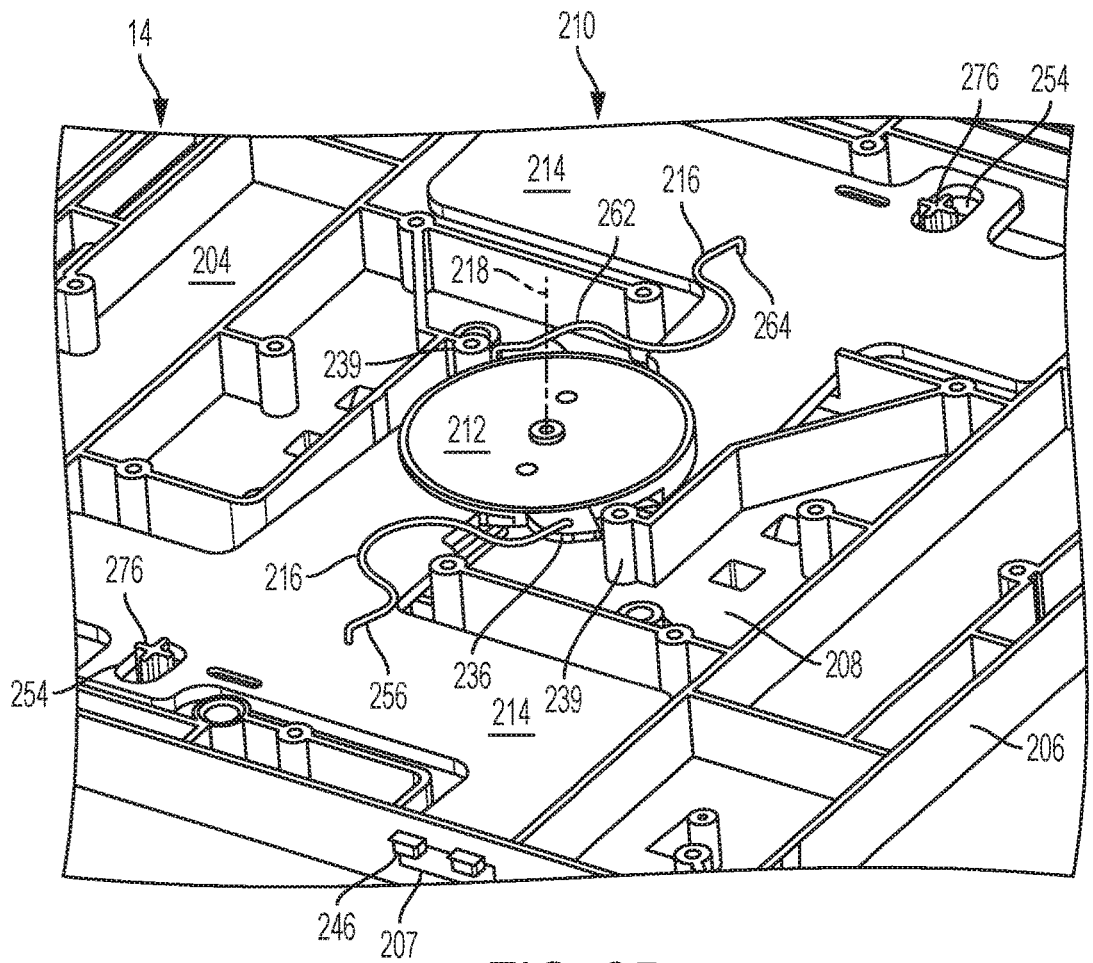
FIG. 35 is a partial perspective view of a latch mechanism mounted within a door assembly of a substrate container according to an embodiment of the disclosure.
Figure 36:
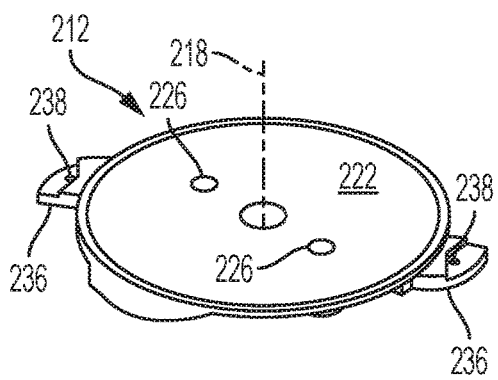
FIG. 36 is a perspective view of a latch cam of FIG. 35 in isolation according to an embodiment of the disclosure.
Figure 39:
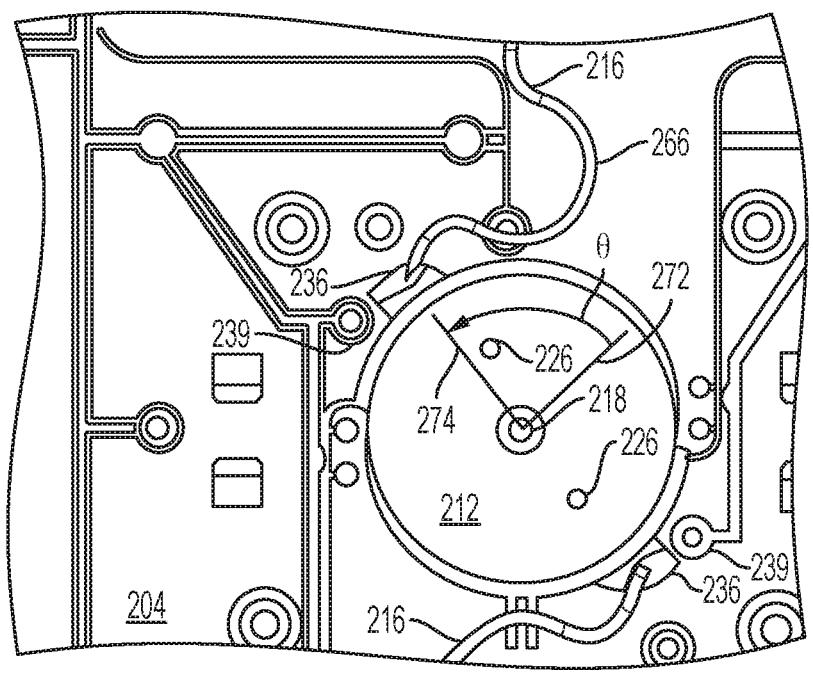
FIG. 39 is a partial plan view of the latch mechanism of FIG. 35 in a latched configuration and depicting the angular displacement of the latch cam according to an embodiment of the disclosure.

In some embodiments, the door assembly 14 includes one or more cam stops 239 that are positioned to engage the latch cam 212 and prevent rotation of the latch cam 212 beyond a certain angular rotation. For example, the cam stop 239 may extend from the back panel 204 and be positioned to engage one or more of the radially protruding tabs 236, such as depicted in FIGS. 35 and 39.

The latch arms 214 are disposed within the interior chamber 208, each including a cam interface profile 242 at a proximal portion 244 and latch tips 246 at a distal portion 248. The latch arms 214 are aligned so that the latch tips 246 extend and retract laterally through the latch tip apertures 207 of the outer peripheral portion 206. In various embodiments, the latch arms 214 are fitted with a cam bearing 252 at the proximal portion 244. The latch arms 214 may also define an elongate aperture 254 having a longitudinal axis 255 that extends in the direction between the proximal portion 244 and the distal portion 248. The latch arm 214 may also include a mounting hole 256 through which the arcuate spring 216 is mounted thereto.

A variety of arcuate springs 216 can be utilized, e.g. arcuate springs 216a through 216d depicted at FIGS. 40A through 40D, respectively. The arcuate springs are referred to generically and collectively as arcuate spring(s) 216, and individually by the numerical reference 216 followed by a letter suffix (e.g., arcuate spring 216a of FIG. 40A). The arcuate springs 216 are configured to route around various standoffs and other structures that make up the door assembly 14 while still exerting a supplemental force between the latch cam 212 and the latch arms 214. The arcuate springs 216 each include a first end 262 and a second end 264, and each defines at least one arcuate segment 266 therebetween over at least a portion of the arcuate spring 216. In the depicted embodiment, the first end 262 of each arcuate spring 216 is pivotally coupled to a respective one of the tabs 236 of the latch cam 212, with the second end being pivotally coupled to a respective one of the latch arms 214. The arcuate springs 216 also define a free or unloaded operating length 268, defined as a straight line between the first end 262 and the second end 264. The arcuate springs 216 may be formed of a resilient wire material, such as stainless steel. Polymer arcuate springs 216 are also contemplated.

Figure 40A:
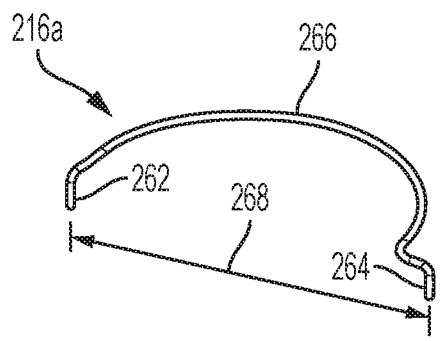
FIGS. 40A through 40D are perspective views of arcuate springs in isolation in embodiments of the disclosure.
Figure 40B:
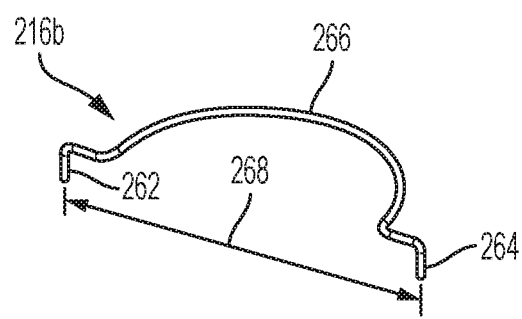
Figure 40C:
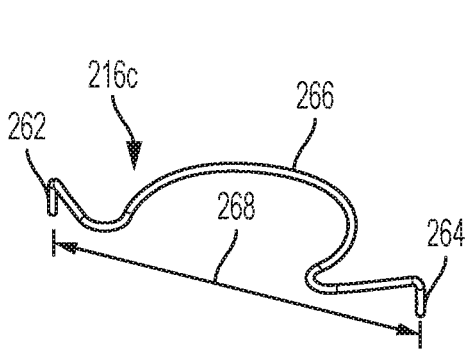
Figure 40D:
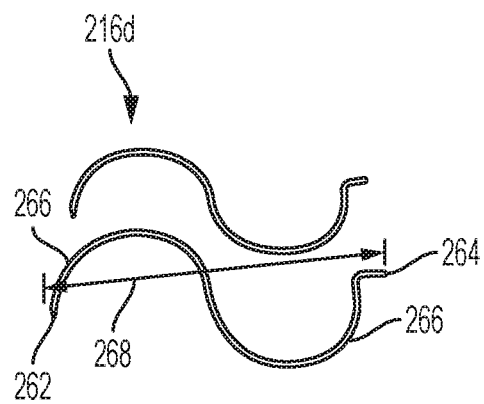
Figure 41:
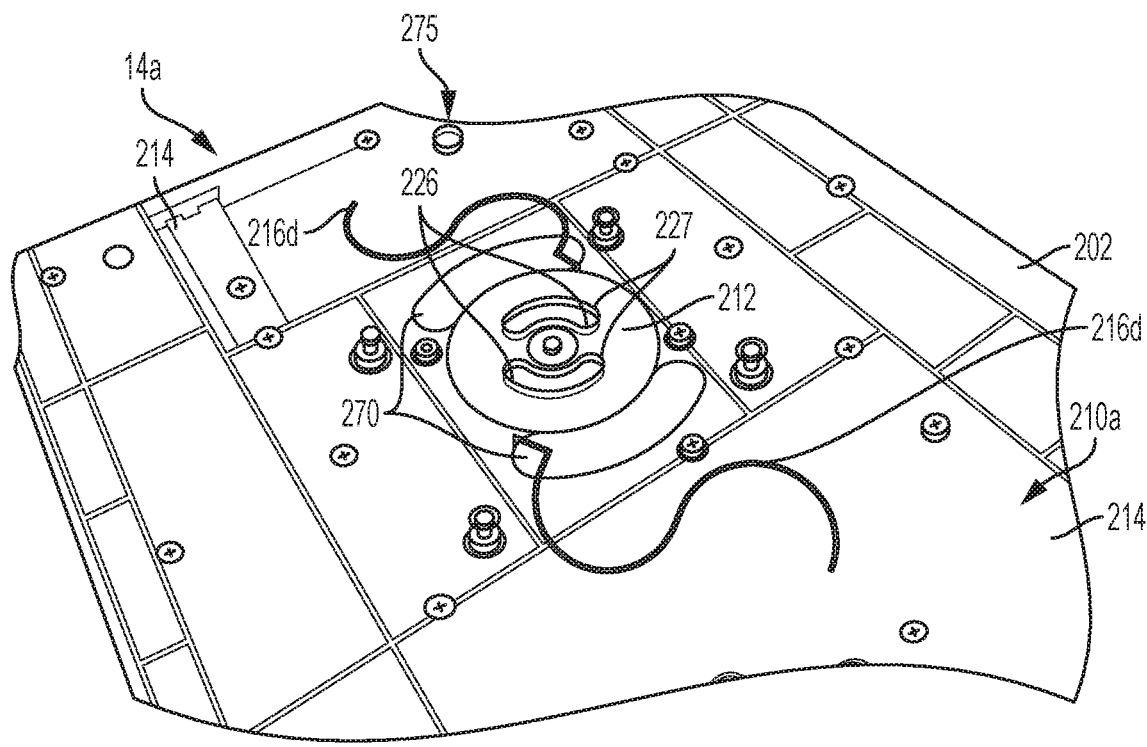
FIG. 41 is a partial perspective view of a latch mechanism having arcuate springs that each define an S-shaped segment, the latch mechanism mounted within a door assembly of a substrate container according to an embodiment of the disclosure.
Figure 42:
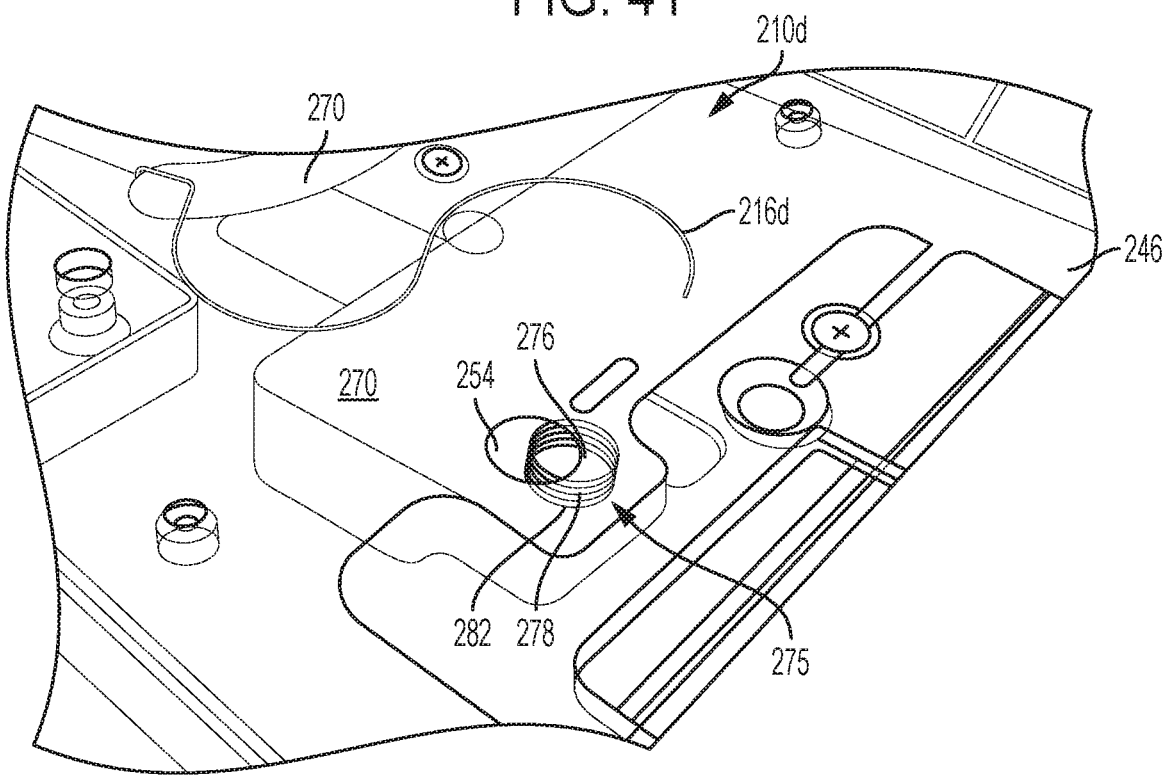
FIG. 42 is an enlarged view of the latch mechanism of FIG. 41 illustrating a guide assembly for biasing the latch arm within the door assembly according to an embodiment of the disclosure.

Referring to FIGS. 41 and 42, a door assembly 14a equipped with a latch mechanism 210a having the S-shaped arcuate springs 216d of FIG. 40D is depicted according to an embodiment of the disclosure. The door assembly 14a and latch mechanism 210a includes many of the same components and attributes as the door assembly 14 and latch mechanism 210, which are indicated with same-numbered numerical references. The front panel 202 is portrayed as transparent or semi-transparent in FIGS. 41 and 42 to demonstrate the inner workings of the door assembly 14a. In addition, the door assembly 14a includes wear pads 270 that are adhered to the inside of the front panel 202 upon which the S-shaped arcuate spring 216d may bear against during actuation of the latch assembly 210a.

Also, the door assembly 14a includes a guide assembly 275 (FIG. 42) that is coupled with the latch arm 214 at the elongate aperture 254 and includes a boss 276 and biasing member 278. The particular biasing member 278 is portrayed as a coil spring, but other biasing members are contemplated and are readily apparent to the artisan. The guide assembly 275 may also include a washer or bushing 282 disposed between the biasing member 278 and the latch arm 214.

Functionally, in the depicted embodiment, the guide assembly maintains alignment of the latch arm 214 so that the latch tips 246 extend and retract through the latch tip apertures 207 in a desired manner. The boss 276 and elongate aperture 254 maintain the necessary alignment in the extension and retraction directions, while the biasing member 278 biases the latch arm 214 against guides 279 (FIGS. 44A and 44B) so that the latch tips 246 pass through the aperture at a desired distance between the front and back panels 202 and 204. The washer or bushing 282, which may be made of a low friction or self-lubricating material, slidably contacts the latch arm 214, enabling the latch arm 214 to translate laterally while being biased against the guides 279.

Figure 43A:
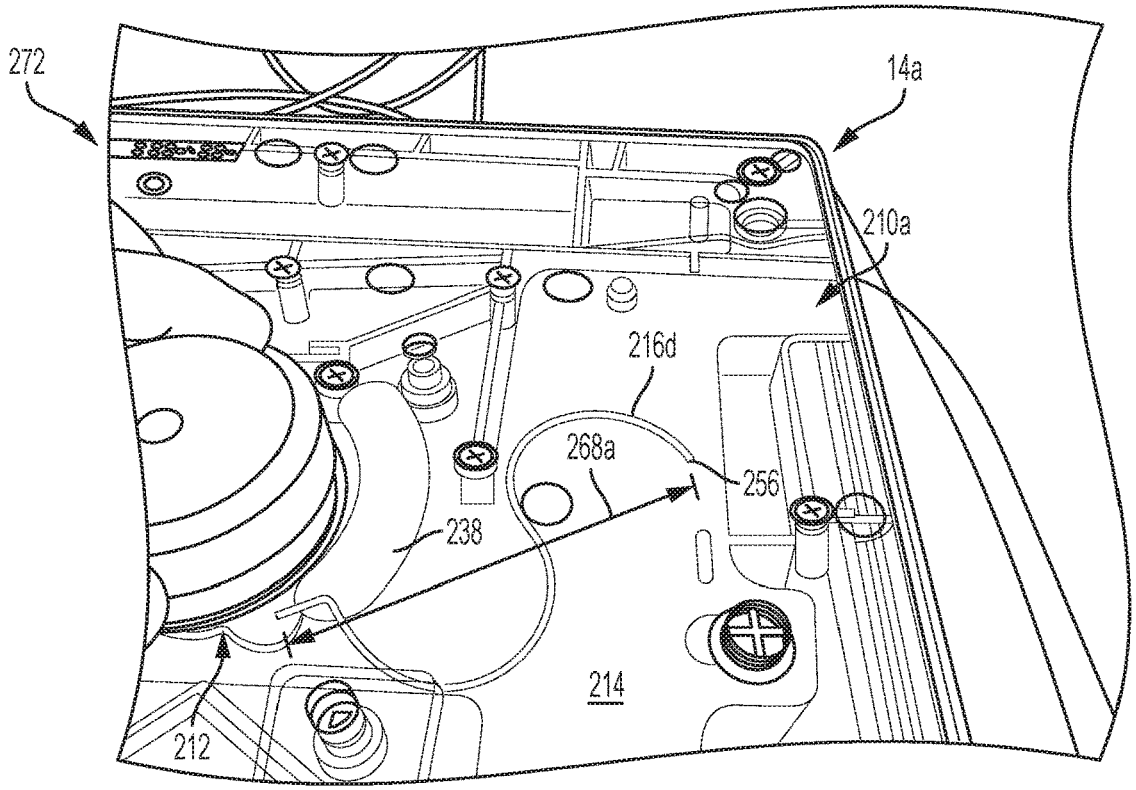
FIG. 43A is a partial view of the latch mechanism of FIG. 41 in an unlatched configuration.
Figure 43B:
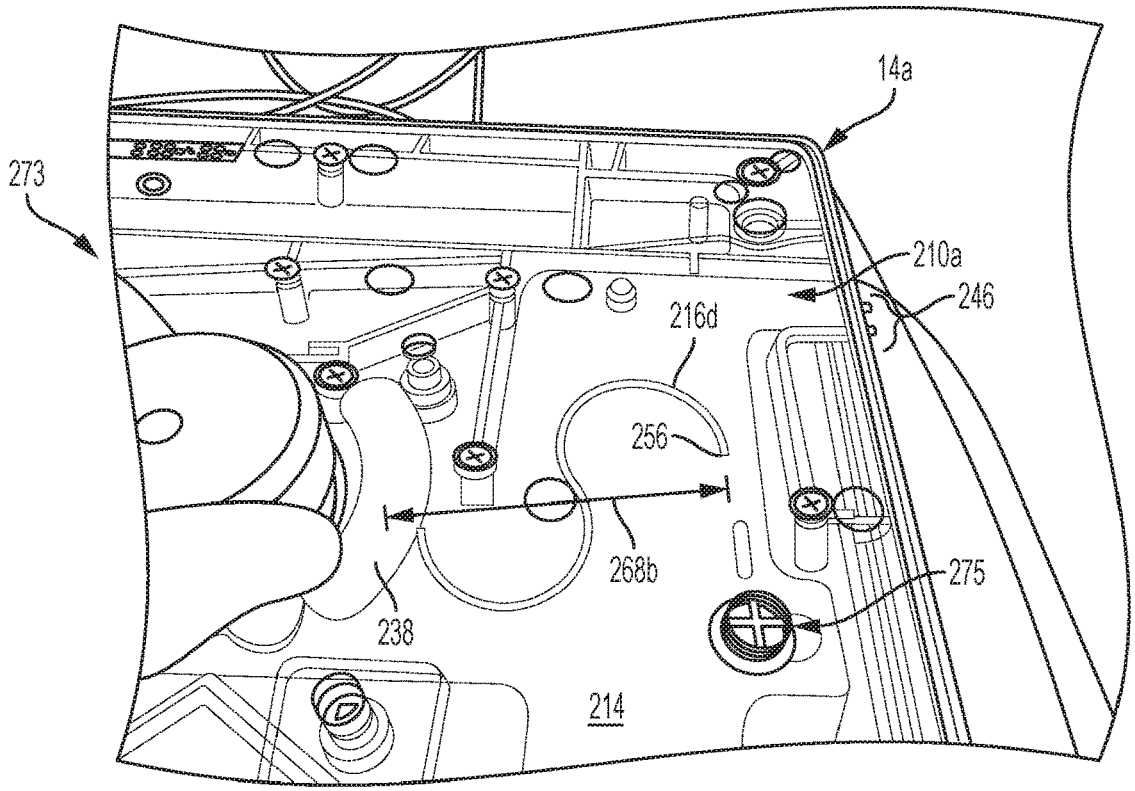
FIG. 43B is a partial view of the latch mechanism of FIG. 41 in an intermediate configuration between a latched and an unlatched configuration according to an embodiment of the disclosure.
Figure 43C:
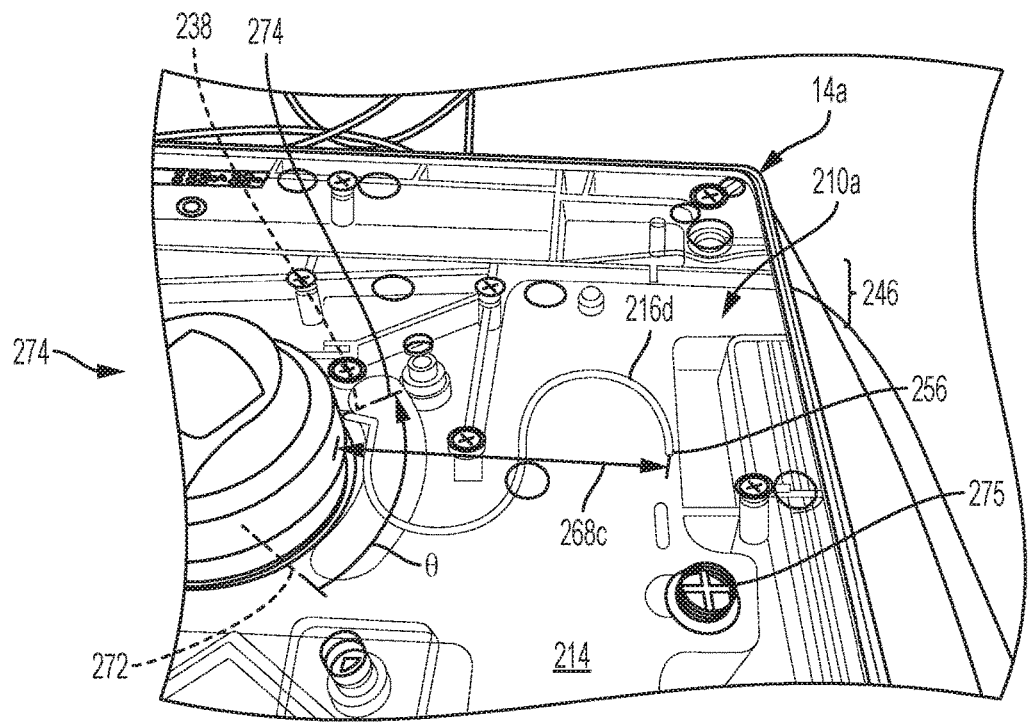
FIG. 43C is a partial view of the latch mechanism of FIG. 41 in a fully latched configuration.
Figure 44A:
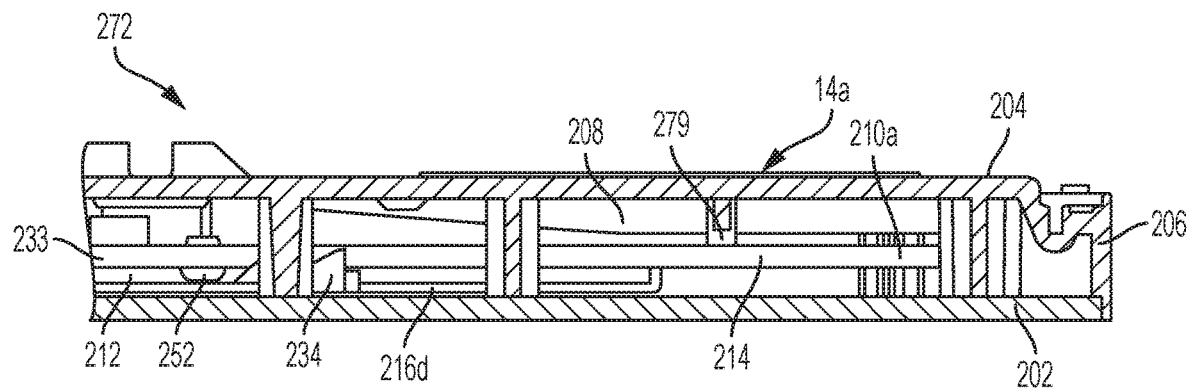
FIG. 44A is a sectional view of the door assembly of FIG. 35 with the latch cam and latch arm in an unlatched configuration according to an embodiment of the disclosure.
Figure 44B:
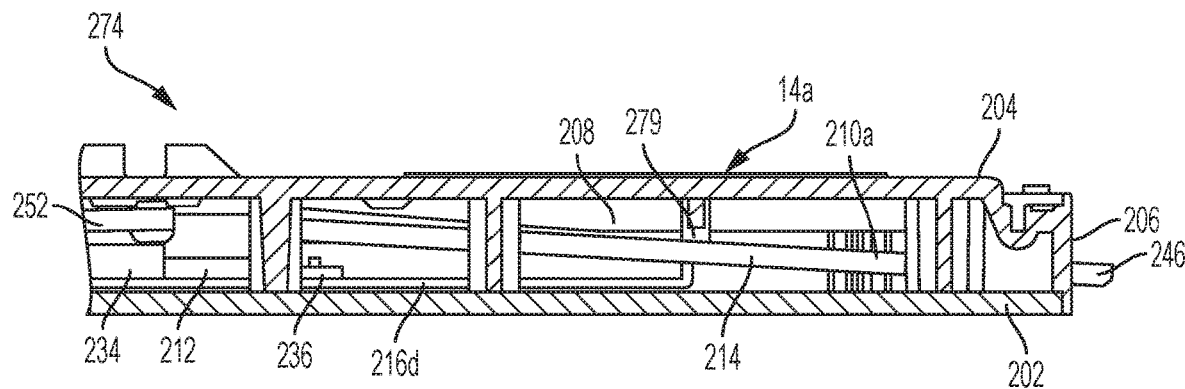
FIG. 44B is a sectional view of the door assembly of FIG. 35 with the latch cam and latch arm in a fully latched configuration according to an embodiment of the disclosure.

Referring to FIGS. 43A through 43C, 44A, and 44B, operation of the latching mechanism 210a is depicted in embodiments of the disclosure. The FIGS. 43A through 43C illustrate the operation of the arcuate springs 216, while the FIGS. 44A and 44B illustrate the interaction between the latch cam 212 and the latch arm 214. While the specific arcuate spring 216 depicted is the S-shaped arcuate spring 216d, any of the arcuate springs 216 of the disclosure will function in a similar manner.

The latch cam 212 is rotated through an actuation angle θ (FIGS. 39 and 43C), from a first angular orientation 272 where the door is in an unlatched configuration to a second angular orientation 274 where the door is in a fully latched configuration (FIG. 39). During this rotation, the arcuate spring 216 undergoes a variation of the operating length 268, depicted in FIGS. 43A, 43B, and 43C as operating lengths 268a, 268b, and 268c, respectively. The operating lengths 268a through 268c are determined by the orientation of the latch cam 212 relative to the cam interface profile 242 of the latch arm 214. That is, the arcuate spring 216 follows and is defined by the distance between the mounting holes 238 and 256. Accordingly, the arcuate spring 216 may be maintained in a compressive state, wherein operative lengths 268a, 268b, and 268c are shorter than the free operative length 268.

In various embodiments, operation of the latch mechanisms 210, 210a is as follows: The operative length 268a is shorter than the free length 268 of the arcuate spring 216 in the unlatched configuration (i.e., at the first angular orientation 272) (FIG. 43A), such that the arcuate spring 216 exerts a compressive force between the latch cam 212 and the latch arm 214. As the latch cam 212 is rotated through the actuation, the latch cam 212 passes through an intermediate angular orientation 273 (FIG. 43B) where the arcuate spring 216 is in a state of maximum compression (FIG. 43B), wherein the operative length 268b is at a minimum length over the course of the actuation (i.e., where the mounting holes 238 and 256 are at the closest proximity to each other). As the latch cam 216 continues through the intermediate angular orientation 274 to the fully latched configuration (second angular orientation 274) (FIG. 43C), the arcuate spring 216 assumes the operative length 268c, which still maintains a compressive load on the arcuate spring 216, but not as great a compressive load as in the intermediate angular orientation 273.

Functionally, the compressive state of the arcuate spring 216 acts to force actuation of the latch mechanism 210, 210a when latching the door assembly 14a. During actuation, compression of the arcuate spring 216 urges the latch arm in towards the latched configuration, thereby providing the force assist. That is, compression of the arcuate spring 216 forces the latch cam 212 to rotate toward the fully latched configuration and the interaction between the cam lobe 228 (FIG. 37) and the cam interface profile 242 (FIG. 38) drives the latch arm 214 to the latched configuration of the second angular orientation 274. Furthermore, arranging the latch mechanism 210, 210a so that the arcuate spring 216 is at a maximum compressive force in the intermediate configuration 273 also helps secure the latching mechanism either in the unlatched configuration of the first angular orientation 272 or in the fully latch configuration of the second angular orientation 274. That is, because the arcuate spring 216 exerts a maximum compressive force at the intermediate angular orientation 273, the arcuate spring 216 can be said to force or assist in forcing the latch cam 212 into an off-center orientation (i.e., either toward the first angular orientation 272 or the second angular orientation 274). The off-center forcing also helps prevent spurious rotation of the latch cam 216.

Meanwhile, in various embodiments and in further reference to FIGS. 44A and 44B, latch cam 212 and latch arms 214 interact as follows: In the unlatched configuration of the first angular orientation 272, the cam bearing 252 is engaged with the planar face 233 of the cammed surface 232 of the latch cam 212 with the latch tips 246 retracted (FIG. 44A). In the depicted embodiment, the planar face 233 is sized so that the cam bearing 252 remains on the planar face 233 as the latch cam 216 reaches or passes through the intermediate angular orientation 273 of FIG. 43B. It is further noted that, in the depicted embodiment, the latch tips 246 are extended upon reaching the intermediate angular orientation 273, as depicted in FIG. 43B. After passing through the intermediate angular orientation 273, the cam bearing 252 rides upon the inclined face 234 of the cammed surface 232, which causes the latch arm 214 to become canted within the interior chamber 208 of the door assembly 14a. The canting of the latch arm 214 causes the extended latch tips 246 to deflect toward the front panel 202 of the door assembly 14a. The deflecting latch tips 246 engage the door frame 28 to exert a seating force on the door assembly 14a to better seal the door assembly 14a within the bottom assembly 26. The configurations of FIGS. 43C and 44B, where the latch tips 246 are laterally extended and deflected toward the front panel 202, is herein referred to as a "fully latched" configuration.

Figure 45A:
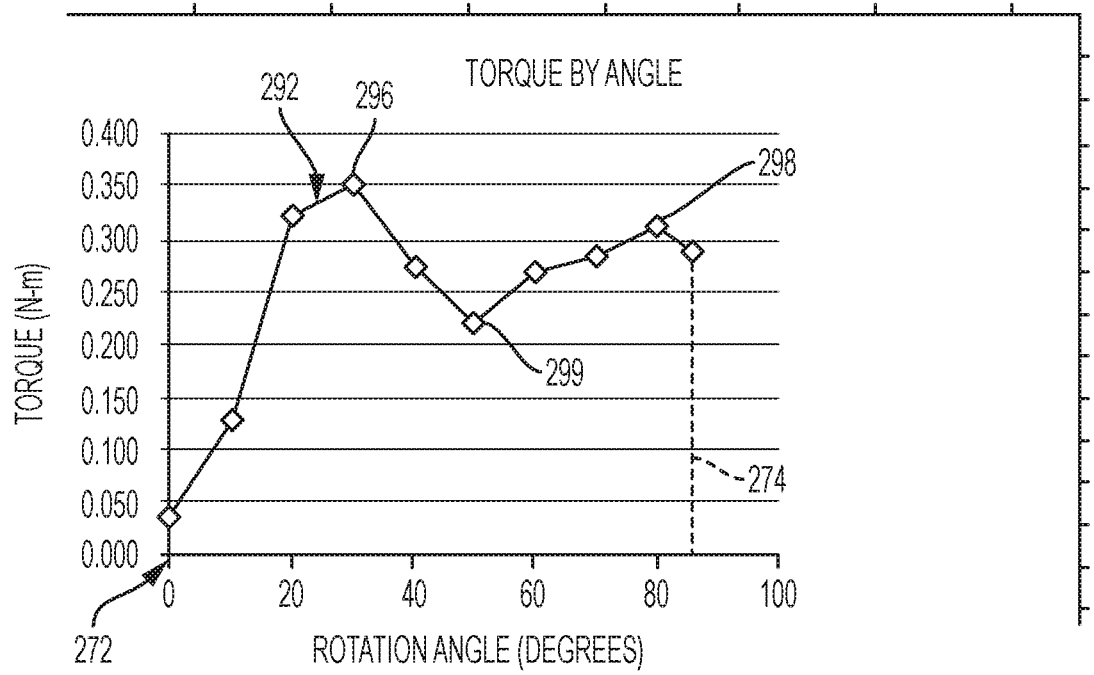
FIG. 45A is a graph plotting torque against the angular orientation required to actuate the latch of the latch mechanism of FIG. 41 according to an embodiment of the disclosure.
Figure 45B:
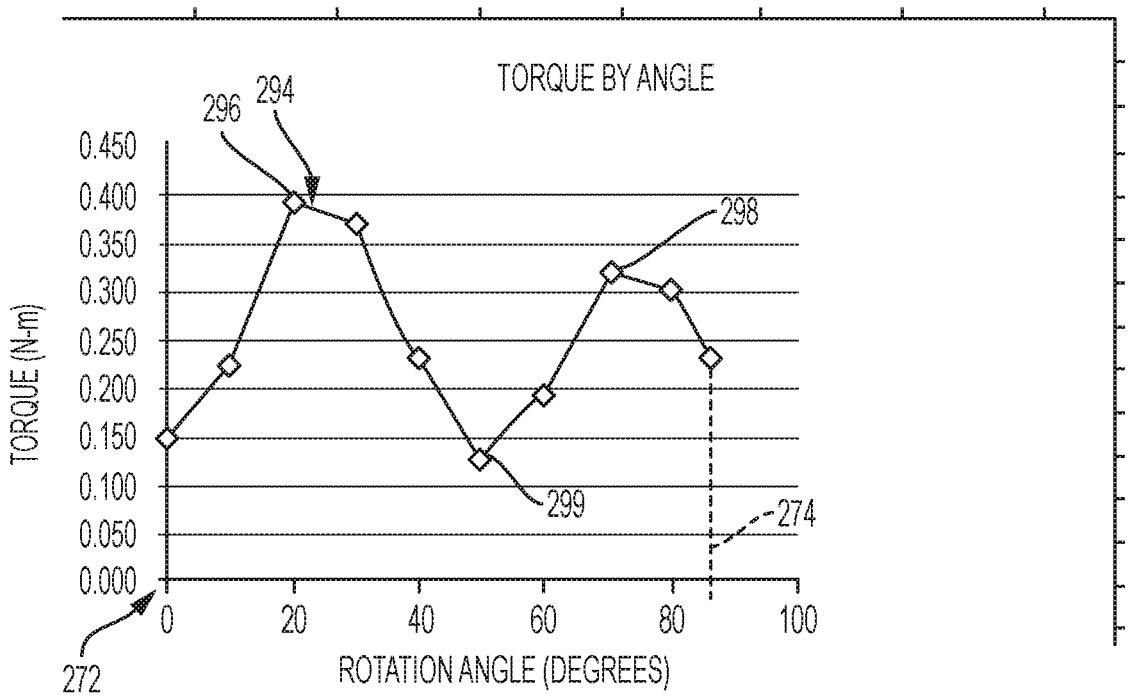
FIG. 45B is a graph plotting torque against the angular orientation required to actuate the latch of the door assembly of FIG. 35 according to an embodiment of the disclosure.

Referring to FIGS. 45A and 45B, predictions 292 and 294 for the torque requirements for actuating the latch mechanisms 210a and 210, respectively, are presented for embodiments of the disclosure. The predictions of FIG. 45A are for actuating the latch mechanism 210a having S-shaped arcuate springs 216d. The predictions of FIG. 45B are for actuating the latch mechanism 210 as illustrated in FIG. 35, which includes arcuate springs 216 that correspond approximately to the arcuate spring 216b of FIG. 40B. Both predictions 292 and 294 present the predicted torque in Newton-meters (N-m) at discrete angular orientations as the latch mechanisms were actuated from the first angular orientation 272 to the second angular orientation 274 (i.e., from an unlatched to a fully latched configuration). Also, the respective door assemblies 14a and 14 were not seated within a container portion 12; that is, the predictions present the torque requirements of the door assemblies 14a and 14 alone, sans any additional torque requirements required to seat the latch tips 246 within the bottom assembly 26.

The predictions presented in FIGS. 45A and 45B predict a maximum torque at the end of cam rotation (i.e., at the second angular orientation 274) without a major increase in the peak torque during spring compression. That is, for the prediction 292 of FIG. 45A, representing the S-shaped arcuate spring 216d, the torque at the second angular orientation 274 is within 20% of the maximum predicted torque (local maximum 296). For the prediction 294 of FIG. 45B, representing an arcuate spring 216 akin to arcuate spring 216b, the torque at the second angular orientation 274 is within 50% of the maximum predicted torque (local maximum 296). These characteristics are attributed to one end of the spring being mounted to the moving latch arm 214, which acts directly on the latch arm 214 as well as assisting in the rotation of the latch cam 212. Thus, while the arcuate springs 216, 216d do store some energy to provide an effective off-center effect, some of the energy imparted to the springs 216, 216d act on the latch arms 214 during the rotation of the latch cam 212, thus providing a more uniform torque profile than would be provided by a spring acting solely on the cam.

Each set of predictions 292 and 294 is characterized by two local maxima 296 and 298, with a local minima 299 defined between. The local minima corresponds approximately to the intermediate angular orientation 273 (e.g., FIG. 43B). The portion of the predictions 292 and 294 from θ=0° to about θ=50° and passing through the local maxima 296 are representative of the torque required to actuate the latch arms 214 from a retracted configuration (e.g., FIG. 43A) to an extended configuration (e.g., FIG. 43B). The portion of the predictions 292 and 294 from about θ=50° to about θ=86° and passing through the local maxima 298 are representative of the torque required to cant the latch arms 214 (e.g., FIGS. 43C and 44B). The minima 299 is indicative of the force assist provided proximate the maximum compression of the arcuate spring 216d, 216 (e.g., FIG. 43B).

Figure 46A:
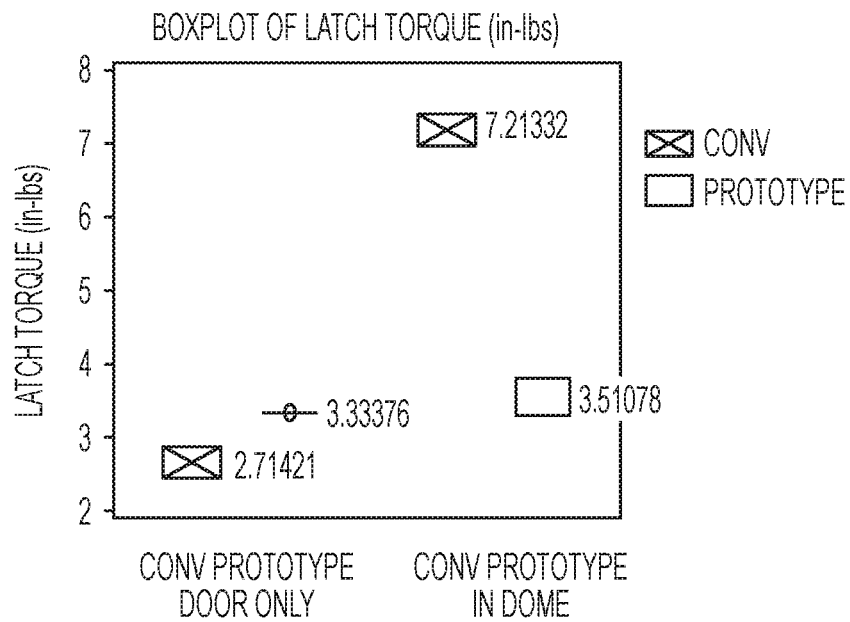
FIG. 46A is a graph comparing latching torque requirements of a latch mechanism of a conventional substrate carrier door with the latch mechanism of FIG. 41 according to an embodiment of the disclosure.
Figure 46B:
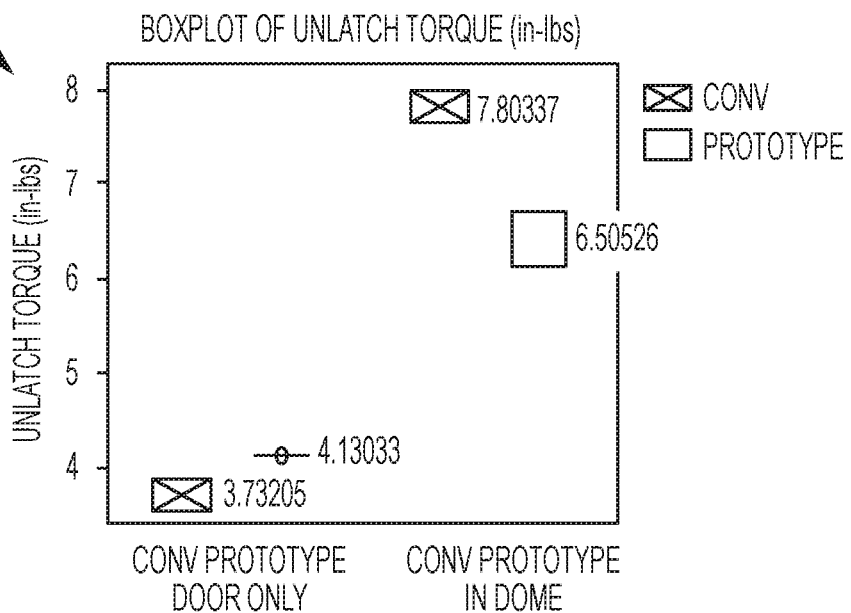
FIG. 46B is a graph comparing unlatching torque requirements of a latch mechanism of the conventional substrate carrier door with the latch mechanism of FIG. 41 according to an embodiment of the disclosure.

Referring to FIGS. 46A and 46B, test results 312 and 314 comparing the torque requirements for operating the door assembly 14a with torque requirements for operating a conventional SMIF pod is presented. In the FIGS. 46A and 46B, "Cony" denotes the conventional SMIF pod, whereas "Prototype" denotes the door assembly 14a of the present disclosure. "Door Only" refers to a stand-alone door (i.e., not seated within a substrate container) and "In Dome" refers to a door seated within a substrate container. The test results 312 present the torque requirements for latching the conventional door and the door assembly 14a, whereas the test results 314 present the torque requirements for unlatching the conventional door and the door assembly 14a. The units of torque for FIGS. 46A and 46B are inch-pounds force (in-lbf).

For the "Door Only" configurations, both the latching torque and the unlatching torque are slightly higher for the "Prototype" (door assembly 14a) than for the "Cony" conventional door. However, for the "In Dome" configurations, both the latching torque and the unlatching torque are markedly less for the "Prototype" door assembly 14a than for the conventional door. This surprising result may be due to the force assist provided by the arcuate spring 216d coupled to the latch cam 212 and the latch arm 214. That is, there may be an increase in torque during the first half of cam rotation due to the increase in work required to compress the arcuate spring 216, 216d, followed by a decrease in maximum torque because the torque provided by the spring during the second half of rotation already includes stored energy that would otherwise be required without the arcuate spring 216, 216d.

Figure 47:
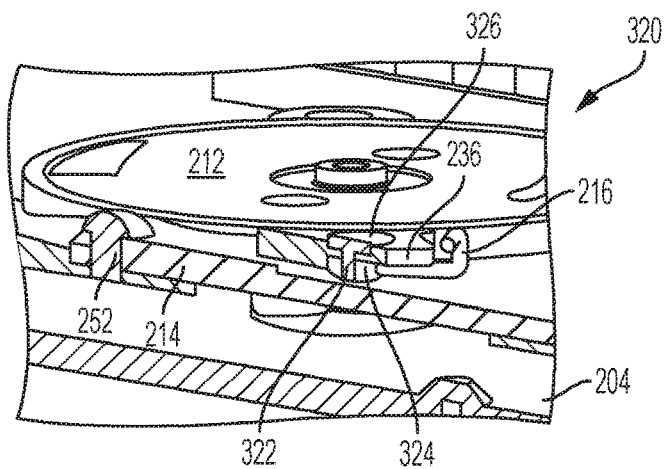
FIG. 47 is a perspective sectional view of a latch cam with a bushing for coupling an arcuate spring thereto according to an embodiment of the disclosure.

Referring to FIG. 47, a modified attachment 320 for the arcuate springs 216 is depicted according to an embodiment of the disclosure. For the depicted embodiment, a bushing 322 is connected to the first end 262 of the arcuate spring 216 and to the radially protruding tab 236 of the latch cam 212. The bushing 322 provides a larger diameter shaft 324 relative to the wire diameter of the arcuate spring 316, the bushing 322 being rotatable within the radially protruding tab 236. The bushing 322 may also be configured to provide a top bearing portion 326 that protrudes above the radially protruding tab 236 and front face 222 of the latch cam 212.

Figure 48A:
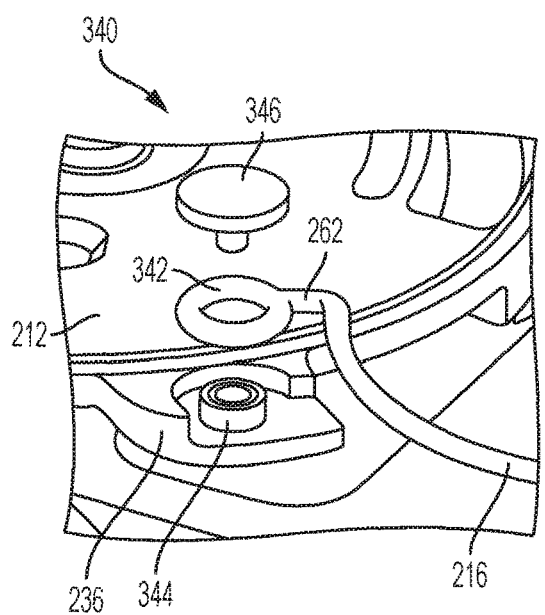
FIG. 48A is an enlarged, perspective, and partially exploded view of a latch cam with a bushing for coupling an arcuate spring thereto according to an embodiment of the disclosure.
Figure 48B:
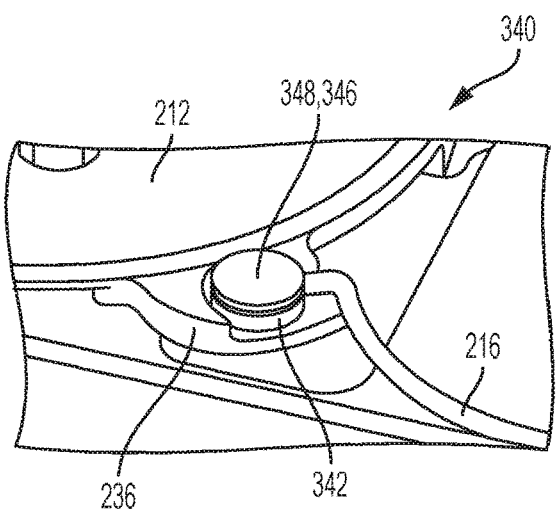
FIG. 48B is a perspective view of the assembled latch cam and bushing of FIG. 48A.

Referring to FIGS. 48A and 48B, another modified attachment 340 is depicted for the arcuate springs 216 according to an embodiment of the disclosure. In the depicted embodiment, the first end 262 of the arcuate spring 216 defines a loop or eye 342 that is sized to rotate about a boss 344 that extends from the radially protruding tab 236. In one or more embodiments, a cap pin 346 is dimensioned to pass through the eye 342 and snap into the boss 344, thereby capturing the first end 262 of the arcuate spring 216. The cap pin 346 may also include a top bearing portion or wear pad 348 that projects above the radially protruding tab 236 and front face 222 of the latch cam 212.

Functionally, the larger diameter shaft 324 of the bushing 322, or the larger diameter of the boss 344, spreads the imparted loads over a larger area relative to the wire diameter of the arcuate spring 216, thereby reducing stresses and reducing particle generation. The top bearing portions 326 and 348 provide a large surface area that may contact the front panel 202 during actuation and which reduce wear and attendant particle generation relative to direct contact with the arcuate spring 216.

Figure 49:
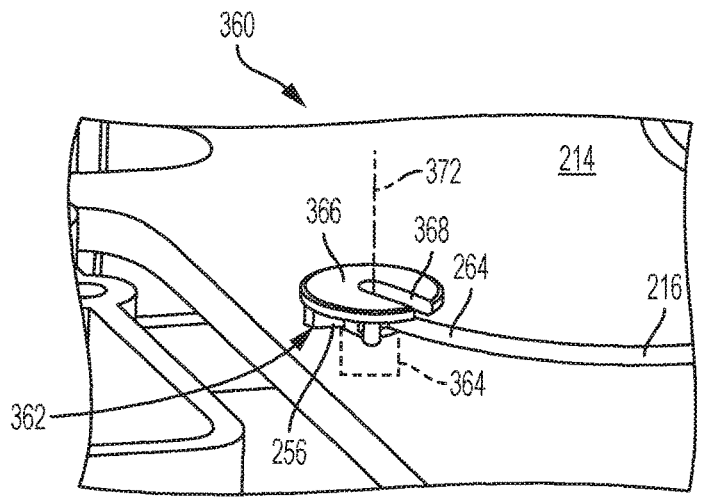
FIG. 49 is an enlarged, perspective view of a bushing coupled to a latch arm and an arcuate spring according to an embodiment of the disclosure.

Referring to FIG. 49, a modified attachment 360 for the second end 264 of the arcuate spring 216 is depicted according to an embodiment of the disclosure. For the depicted embodiment, a bushing 362 is connected to the second end 264 of the arcuate spring 216 and to the latch arm 214. The bushing 362 provides a larger diameter shaft 364

("larger" relative to the wire diameter of the arcuate spring 216), the shaft 364 extending into and being rotatable within the latch arm 214. The bushing 362 may also be configured to provide a top bearing portion 366. The top bearing portion 366 may also define a laterally extending slot 368 that extends from the center through an edge of the top bearing portion 366. The bushing defines a pivot axis 372 about which the second end 264 of the arcuate spring 216 rotates.

Functionally, the larger diameter shaft 364 of the bushing 362 spreads the imparted loads over a larger area relative to the wire diameter of the arcuate spring 216, thereby reducing stresses and attendant particle generation. The top bearing portion 366 provides a large surface area that may contact the front panel 202 during actuation and which reduces wear and attendant particle generation relative to direct contact with the arcuate spring 216. The laterally extending slot 368 enables the second end 264 of the arcuate spring 216 to be readily snapped into the bushing 362 during assembly, and also enables the second end 264 of the arcuate spring 216 to tilt from parallel to the pivot axis 372 (FIG. 44A) to non-parallel to the pivot axis 372 as the pivot arm 214 is canted during actuation (FIG. 44B).

Each of the additional figures and methods disclosed herein can be used separately, or in conjunction with other features and methods, to provide improved devices and methods for making and using the same. Therefore, combinations of features and methods disclosed herein may not be necessary to practice the disclosure in its broadest sense and are instead disclosed merely to particularly describe representative and preferred embodiments.

Various modifications to the embodiments may be apparent to one of skill in the art upon reading this disclosure. For example, persons of ordinary skill in the relevant art will recognize that the various features described for the different embodiments can be suitably combined, un-combined, and re-combined with other features, alone, or in different combinations. Likewise, the various features described above should all be regarded as example embodiments, rather than limitations to the scope or spirit of the disclosure.

Persons of ordinary skill in the relevant arts will recognize that various embodiments can include fewer features than illustrated in any individual embodiment described above. The embodiments described herein are not meant to be an exhaustive presentation of the ways in which the various features may be combined. Accordingly, the embodiments are not mutually exclusive combinations of features; rather, the claims can include a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

References to "embodiment(s)", "disclosure", "present disclosure", "embodiment(s) of the disclosure", "disclosed embodiment(s)", and the like contained herein refer to the specification (text, including the claims, and figures) of this patent application that are not admitted prior art.

For purposes of interpreting the claims, it is expressly intended that the provisions of 35 U.S.C. 112(f) are not to be invoked unless the specific terms "means for" or "step for" are recited in the respective claim.

What is claimed is:

1. A substrate container, comprising
a container portion including a door frame defining an opening;
a door configured to mount within said door frame;
an actuation linkage assembly including a frame, a substrate retainer assembly, and a spindle, said spindle being pivotally mounted to said frame and to said substrate retainer assembly, said frame being mounted to an interior wall of said container portion, said substrate retainer assembly being extendible into said opening of said door frame,
said actuation linkage assembly being selectively configurable in a substrate retention position wherein said substrate retainer assembly is configured to be in contact with and actuated by said door when said door is seated within said door frame,
said actuation linkage assembly being selectively configurable in a substrate non-retention position wherein said substrate retainer assembly is configured to extend into said opening of said door frame when said door is absent from said door frame; and
a biasing member operatively coupled to at least one of said frame, said spindle, and said substrate retainer assembly, said biasing member biasing said actuation linkage assembly in said substrate non-retention position, wherein said biasing member includes a spring arm extending from said frame and contacting one of said spindle and said substrate retainer assembly and wherein said spring arm slidably contacts said spindle.

2. The substrate container of claim 1, further comprising:
a wheel and axle mounted to a lower end of the substrate retainer assembly, the axle being retained to the substrate retainer assembly by a clip-in structure defined at the lower end of the substrate retainer assembly; and
a wheel retention clip mounted to the substrate retainer assembly and configured to prevent the axle from being released from the substrate retainer assembly, the actuation linkage assembly being selectively configurable in a substrate retention position wherein the substrate retainer assembly is in contact with the wheel and actuated by the door when the door is seated within the door frame, the wheel being configured to roll along an interior surface of the door.

3. The substrate container of claim 2, wherein the wheel retention clip includes a plurality of hook portions that couple with the substrate retainer assembly to secure the wheel retention clip to the substrate retainer assembly.

4. The substrate container of claim 3, wherein the substrate retainer assembly includes a base that defines an aperture;
at least one of the plurality of hook portions of the wheel retention clip being coupled to a perimeter of the aperture; and
the wheel retention clip includes registration structures for registering the wheel retention clip within the aperture.

5. The substrate container of claim 2, further comprising a wheel yoke at the lower end of the substrate retainer assembly, the wheel and axle being mounted to the wheel yoke, wherein
the wheel retention clip includes a plurality of hook portions that couple with the substrate retainer assembly to secure the wheel retention clip to the substrate retainer assembly;

the clip-in structure of the substrate retainer assembly includes a resilient cantilever that exerts a biasing force against the axle to retain the axle within the wheel yoke; and the wheel retention clip is configured to prevent the resilient cantilever of the clip-in structure from deflecting, thereby preventing the clip-in structure from releasing the axle.

6. The substrate container of claim 5, wherein at least one of the plurality of hook portions of the wheel retention clip are coupled with the wheel yoke.

* * * * *